United States Patent [19]

Izumi et al.

[11] Patent Number: 5,400,072
[45] Date of Patent: Mar. 21, 1995

[54] VIDEO CAMERA UNIT HAVING AN AIRTIGHT MOUNTING ARRANGEMENT FOR AN IMAGE SENSOR CHIP

[75] Inventors: Akiya Izumi; Iwao Takemoto; Hiroichi Sokei; Masahiko Kodowaki; Takamasa Naito; Hiroyoshi Kojima; Atsumu Iguchi; Masaaki Yokoyama, all of Mobara; Junichirou Nakajima, Atsugi; Masayuki Takahashi, Fujisawa; Kunio Niwa, Ebina, all of Japan

[73] Assignees: Hitachi, Ltd., Tokyo; Echo Co., Ltd., Kanagawa, both of Japan

[21] Appl. No.: 480,979

[22] Filed: Feb. 16, 1990

Related U.S. Application Data

[63] Continuation-in-part of Ser. No. 289,041, Dec. 23, 1988, abandoned.

[30] Foreign Application Priority Data

Mar. 17, 1989 [JP] Japan ..................... 1-63761
Jun. 28, 1989 [JP] Japan ..................... 1-163970

[51] Int. Cl.⁶ ............................................. H04N 5/225
[52] U.S. Cl. ...................................................... 348/335
[58] Field of Search .................. 358/209, 213.11, 225, 358/229; H04N 5/225, 5/335; 359/811, 815, 819, 821, 600; 348/207, 335, 340, 294, 311

[56] References Cited

U.S. PATENT DOCUMENTS

| | | | |
|---|---|---|---|
| 4,258,982 | 3/1981 | Skinner et al. | 359/819 |
| 4,303,306 | 12/1981 | Ookawa | 359/819 |
| 4,594,613 | 6/1986 | Shinbori et al. | 358/213.11 |
| 4,639,096 | 1/1987 | Kitagishi et al. | 359/686 |
| 4,734,778 | 3/1988 | Kobayashi | 358/229 |
| 4,810,076 | 3/1989 | Murao et al. | 359/738 |
| 4,896,217 | 1/1990 | Hiyazawa | 358/213.11 |

FOREIGN PATENT DOCUMENTS

| | | | |
|---|---|---|---|
| 48-64927 | 7/1973 | Japan . | |
| 56-152382 | 11/1981 | Japan | H04N 5/30 |
| 60-87860 | 11/1986 | Japan | H04N 5/225 |
| 3-276111 | 12/1991 | Japan | G02B 7/02 |

Primary Examiner—Michael T. Razavi
Assistant Examiner—Tuan V. Ho
Attorney, Agent, or Firm—Antonelli, Terry, Stout & Kraus

[57] ABSTRACT

A video camera unit is separated into a holder for receiving lenses and a base on which a solid-state image pickup chip is mounted. The holder and the base are assembled together with the distance between them made variable so that it is possible to adjust the back focus of the lens. Further, a video camera unit has a holder which is separated into a first holder for receiving lenses and a second holder for receiving a solid-state image pickup device so that both holders can be assembled together with the distance between them made variable. Therefore, it is also possible to adjust the back focus of the lens.

20 Claims, 34 Drawing Sheets

S1~S4—LIGHT SHIELD PLATE
L1~L4—PLASTIC LENS
1 — HOLDER
2 — BASE
6 4 —SOLID-STATE IMAGE SENSOR CHIP
114—LENS HOLDING COVER
200—SLEEVE
250—TRANSPARENT CAP

S1~S4 — LIGHT SHIELD PLATE
L1~L4 — PLASTIC LENS
1 — HOLDER
2 — BASE
64 — SOLID-STATE IMAGE SENSOR CHIP
114 — LENS HOLDING COVER
200 — SLEEVE
250 — TRANSPARENT CAP

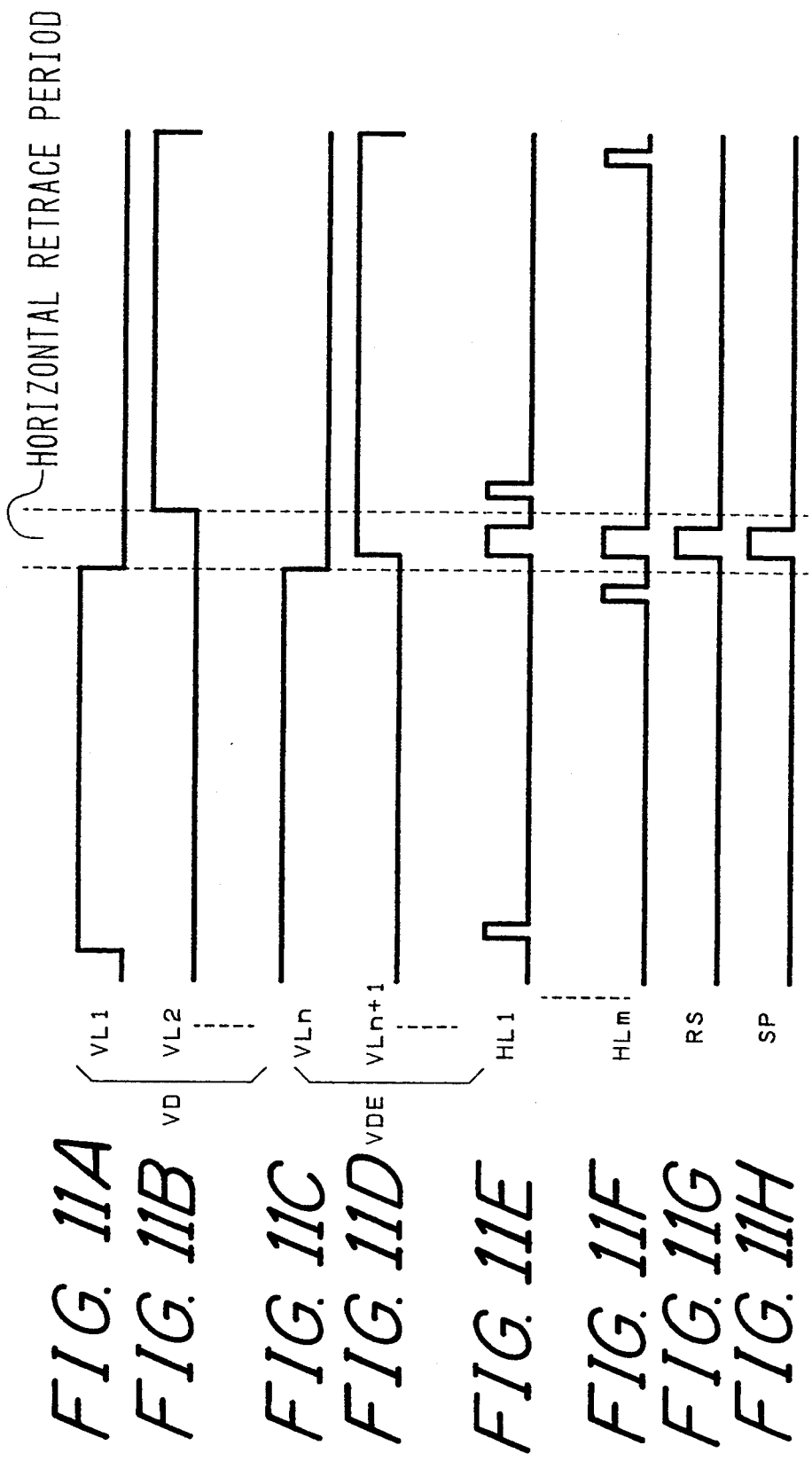

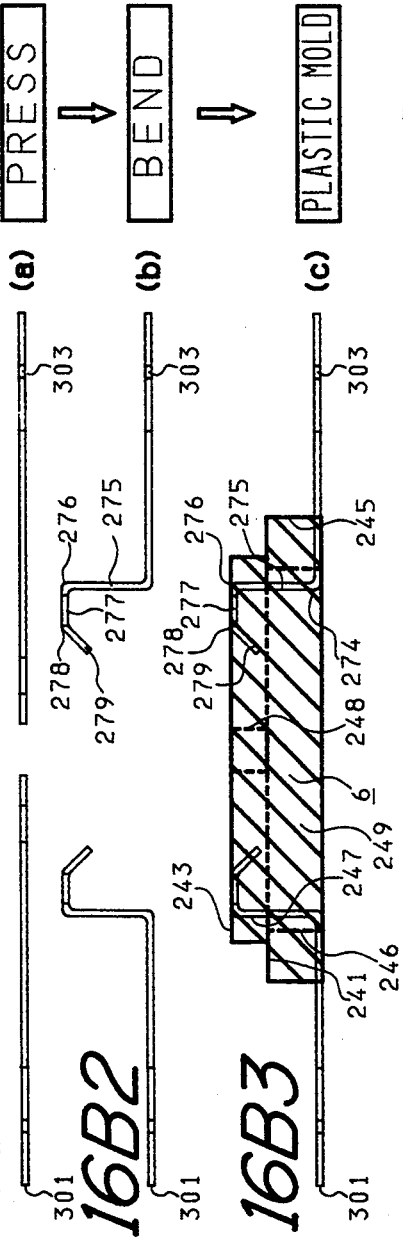

S1~S4 — LIGHT SHIELD PLATE
L1~L4 — PLASTIC LENS
1 — HOLDER
6 — SOLID-STATE IMAGE SENSOR
64 — SOLID-STATE IMAGE SENSOR CHIP
114 — LENS HOLDING COVER
200 — SHIELD CASE
250 — TRANSPARENT CAP

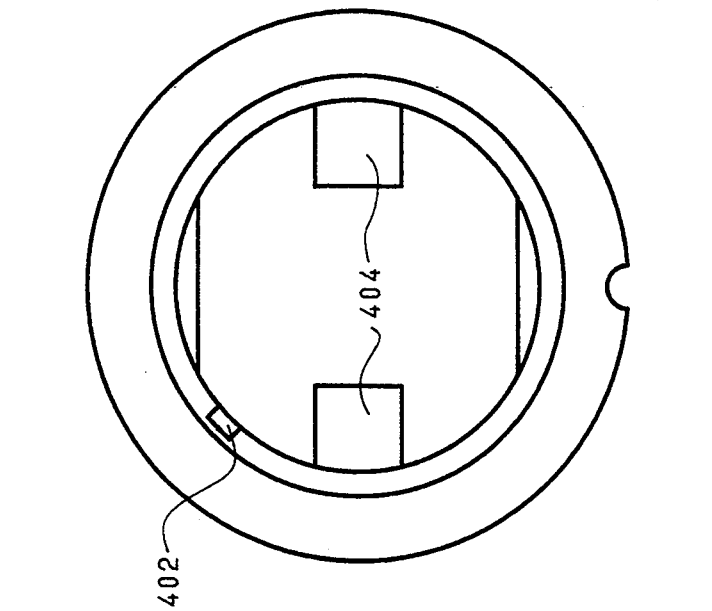
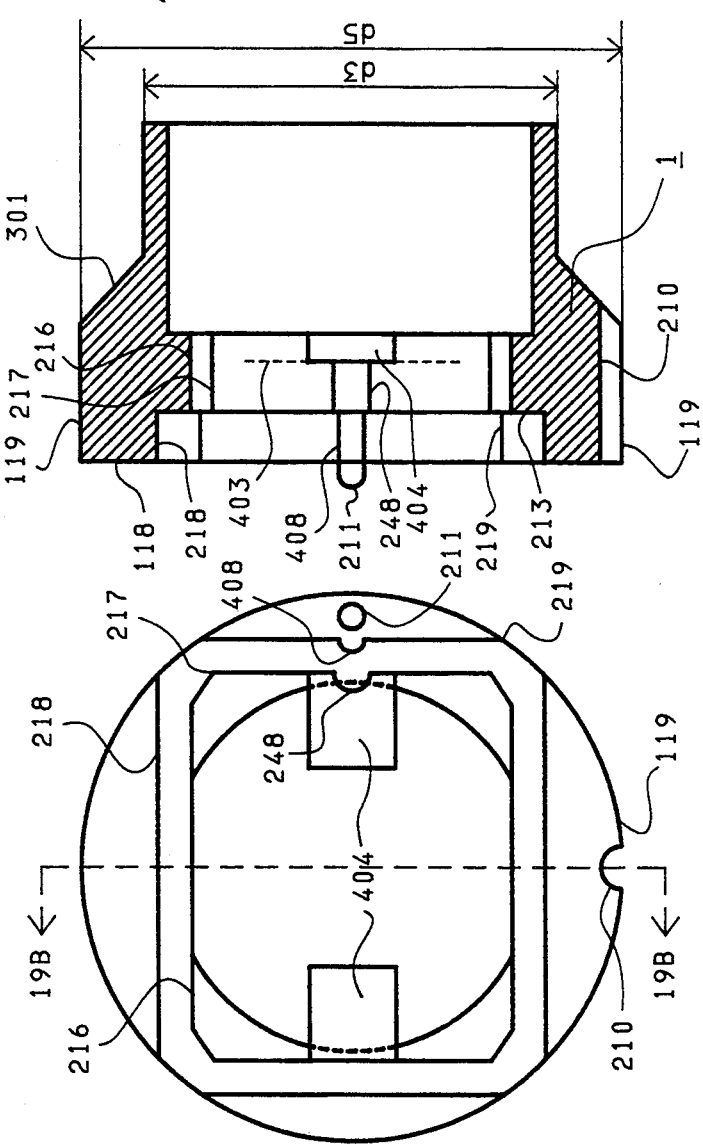

PD — PHOTO-DIODE ARRAY
OB — OPTICAL BLACK
VSR — VERTICAL SHIFT REGISTER
    FOR READING
HSR — HORIZONTAL SHIFT REGISTER
RSM — MOSFET FOR RESET
ROU — MOSFET FOR READING

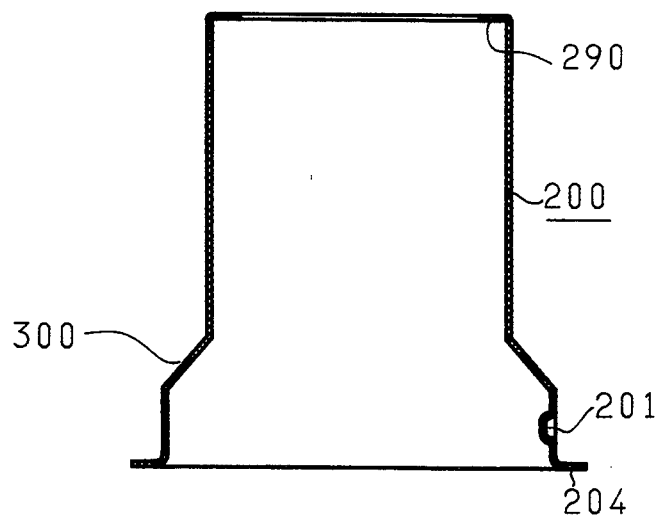
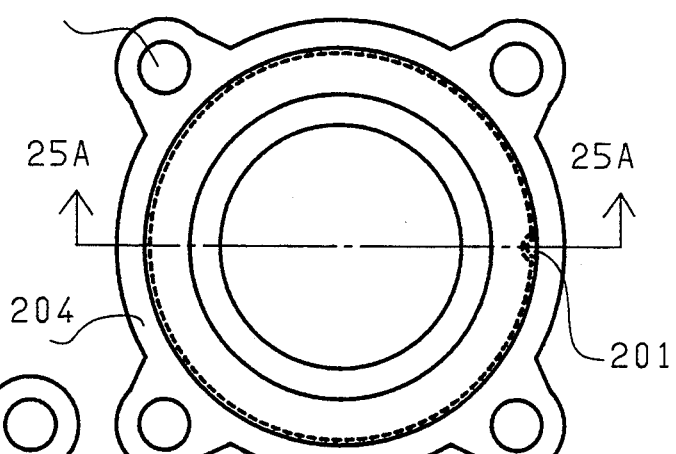
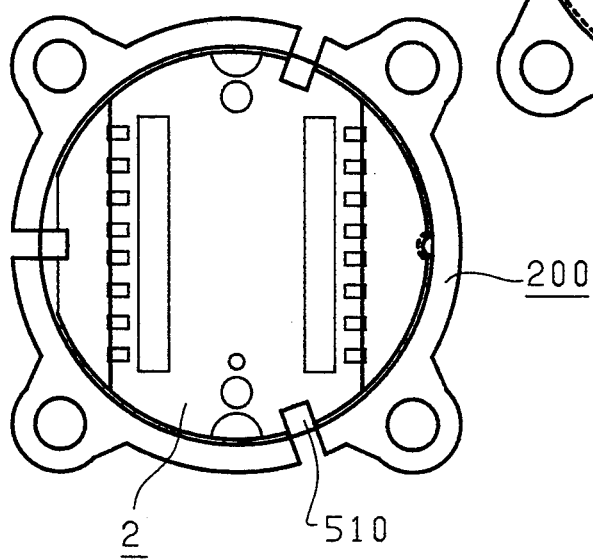

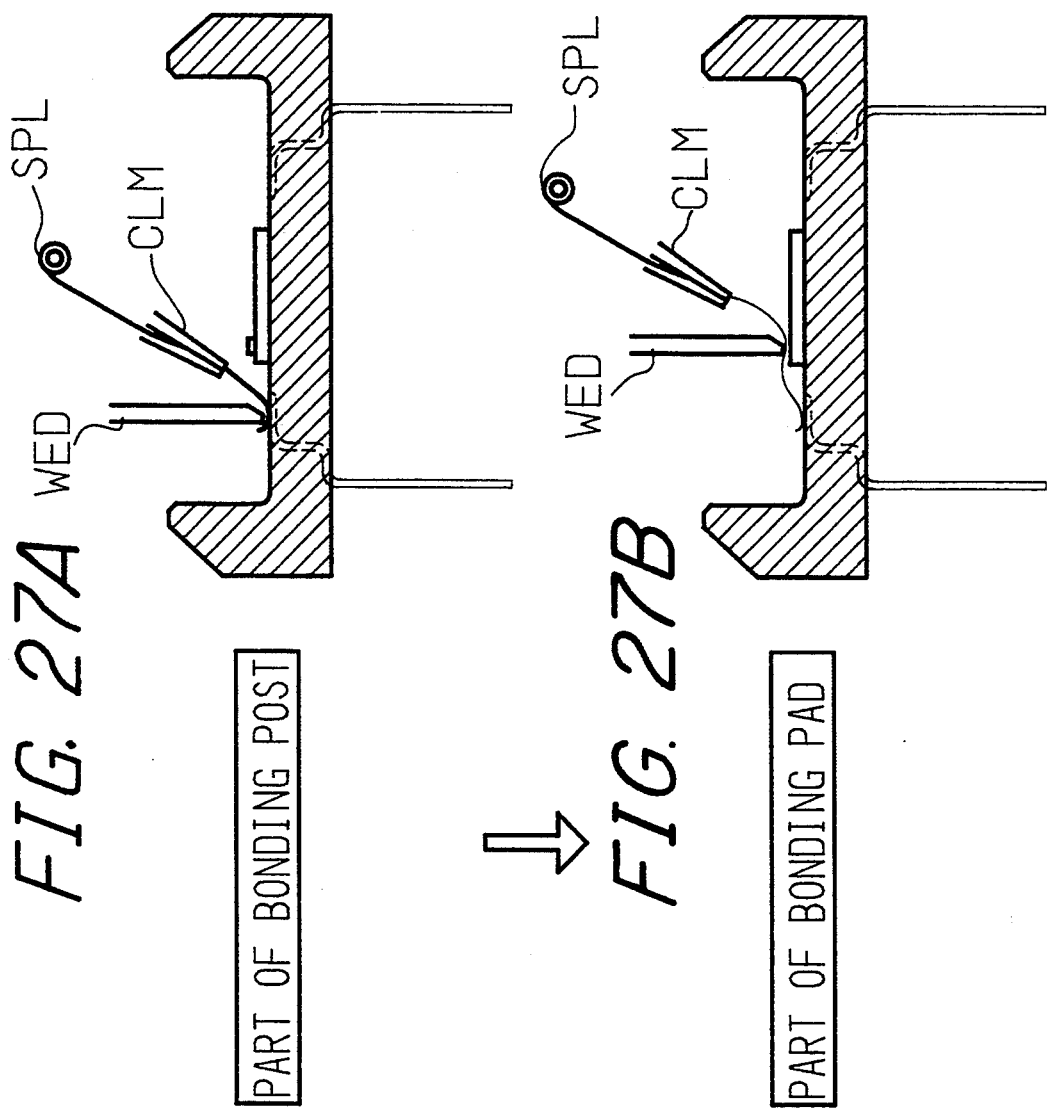

S1~S4— LIGHT SHIELD PLATE
L1~L4— PLASTIC LENS
1, 2— HOLDER
6— SOLID-STATE IMAGE SENSOR
64— SOLID-STATE IMAGE SENSOR CHIP
114— LENS HOLDING COVER
200— SHIELD CASE
250— TRANSPARENT CAP

VIDEO CAMERA UNIT HAVING AN AIRTIGHT MOUNTING ARRANGEMENT FOR AN IMAGE SENSOR CHIP

This application is a continuation-in-part application of U.S. Ser. No. 07/289,041, filed Dec. 23, 1988, now abandoned.

BACKGROUND OF THE INVENTION

The present invention relates to a video camera unit and, more particularly, to a compact and blight video camera unit.

Recently, there has been developed a very compact ⅓-inch solid-state image pickup device, and efforts have been made to develop a door scope TV camera or the like as one of its main applications.

A wide angle lens used therein is constructed by combining 8 to 10 lenses since it must have certain optical properties relative to spherical aberration, astigmatism, distortion aberration, chromatic aberration, sine condition, etc. (as disclosed in e.g. Japanese Patent Unexamined Publication No. 48-64927). Further, a solid-state image pickup chip (IC chip) constructed by combining a photodiode and a switch MOSFET is publicly known as disclosed in e.g. Japanese Patent Unexamined Publication No. 56-152382. In the television camera for monitoring, family use, etc., which uses the above solid-state image pickup chip, an optical lens is provided with an automatic diaphragm or stop mechanism.

However, the above wide angle lens, which is constructed by many lenses, is not suitable to miniaturization.

Also, the above lens provided with an automatic diaphragm mechanism requires relatively complicated mechanical component parts, resulting in enlargement of the lens portion in the television camera and increase in production cost therefor. Further, the above automatic diaphragm mechanism which is constructed by relatively complicated mechanical component parts involves another problem in the point of reliability as well due to possible abrasion of the mechanical structure portion.

SUMMARY OF THE INVENTION

An object of the present invention is to provide a very compact video camera unit.

Another object of the present invention is to provide a video camera unit having a function of adjusting the back focus of the lens.

Still another object of the present invention is to provide a method for manufacturing a video camera unit having a function of adjusting the back focus of the lens.

A further object of the present invention is to provide an inexpensive video camera unit.

A still further object of the present invention is to provide a video camera unit which provides excellent mass-productivity.

A yet further object of the present invention is to provide a bright and compact video camera unit.

A further object of the present invention is to provide a video camera unit in which an electrical diaphragm is applicable.

A further object of the present invention is to provide a video camera unit less likely to be affected by external electrostatic noise.

A further object of the present invention is to provide a video camera unit with high reliability.

A further object of the present invention is to provide a video camera unit with high assembling accuracy.

A further object of the present invention is to provide a solid-state image pickup device which is suitable to the very compact video camera unit.

In accordance with one aspect of the present invention, there is provided a video camera unit having a holder for receiving lenses and a base on which a solid-state image pickup chip is mounted, and capable of adjusting the distance between the holder and the base.

According to another aspect of the present invention, there is provided a video camera unit having a first holder for receiving lenses and a second holder on which a solid-state image pickup device is mounted, and capable of adjusting the distance between the two holders.

Since the video camera unit is separated into the holder for receiving the lenses and the base on which the solid-state image pickup chip is mounted, it is possible to adjust the back focus of the lens by assembling together the holder and the base with the distance between them made variable.

Further, since the holder is separated into the first holder for receiving the lenses and the second holder for receiving the solid-state image pickup device, it is possible to adjust the back focus of the lens by assembling together both holders with the distance between them made variable.

BRIEF DESCRIPTION OF THE DRAWINGS

The above and other objects, features and advantages of the present invention will become more clear from the following description of preferred embodiments, with reference to the accompanying drawings, in which:

FIG. 11 is a timing chart showing an example of the operation of the solid-state image pickup chip;

FIGS. 12A to 16 are developments of main component parts of the video camera unit shown in FIGS. 17A and 17B, in which:

FIG. 12A is a sectional view of a holder 1;
FIGS. 16B are a series of (five) sectional views for explanation of the steps in assembling the solid-state image pickup device 6;
FIGS. 18 to 21 are developments of main component parts of a video camera unit shown in FIGS. 28A and 28B, in which:

FIG. 19A is a bottom view of a holder 1;
FIG. 19B is a sectional view thereof;
FIG. 19C is a top view thereof;
FIG. 21 is a view illustrating the layout of a solid-state image pickup chip 64;
FIGS. 22 to 27 are developments of main component parts of the video camera unit shown in FIGS. 1A and 1B, in which:

FIG. 25A is a top view of a sleeve;
FIG. 25B is a sectional view thereof;
FIG. 25C is a bottom view of the video camera unit according to another method;
FIGS. 27 are explanatory views showing the wire bonding method according to the present invention.

DETAILED DESCRIPTION OF PREFERRED EMBODIMENTS

Embodiment 1

Figure 2A:
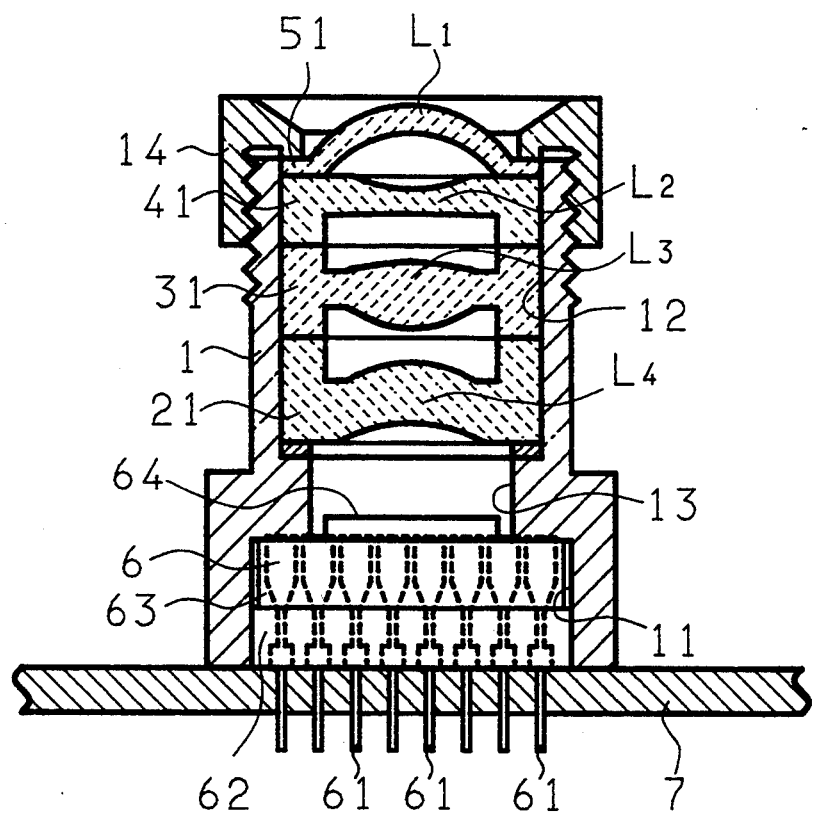
FIG. 2A is a sectional view of a video camera unit in accordance with another embodiment of the present invention.
Figure 2B:
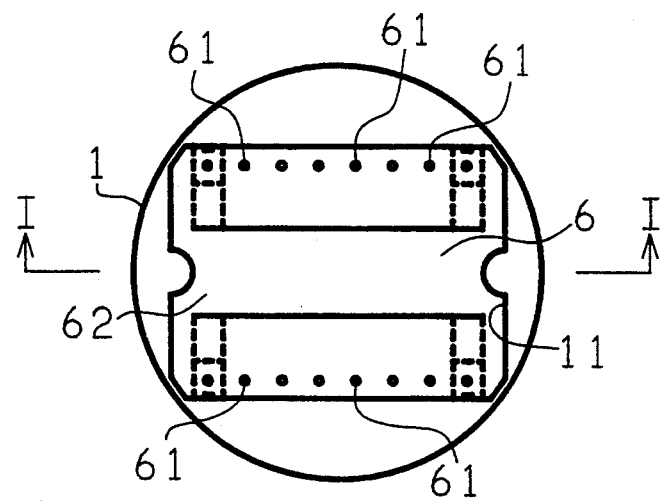
FIG. 2B is a plan view thereof.

FIGS. 2A to 4 and Table 1 show a wide angle lens in accordance with the present invention, and a very compact TV camera unit using it. FIG. 2A is a sectional view of the camera unit and FIG. 2B is a plan view when viewed from the bottom side thereof (from the image pickup device side). In FIGS. 2A and 2B, reference numeral 1 denotes a cylindrical lens holder having an image pickup device receiving section 11 formed in its base portion. Reference characters L1, L2, L3 and L4 denote a set of combined plastic lenses fitted in a lens receiving section 12 of the lens holder 1. Reference numeral 6 denotes a solid-state image pickup device incorporated in the image pickup device receiving section 11 so as to correspond to the above lenses.

The lens holder 1 is made of material having a thermal expansion coefficient approximately equal to that of the plastic lenses L1 to L4, e.g., synthetic resin. The image pickup device receiving section 11 is formed in the shape of a rectangular parallelepiped so as to exactly receive the image pickup device 6. An inward flange 13 is provided between the image pickup device receiving section 11 and the lens receiving section 12 so as to enable the lenses L1 to L4 and the solid-state image pickup device 6 to be aligned with each other. A ring-shaped cover 14 is attached at an end of the holder 1 lest the lenses should fall out.

Figure 4:
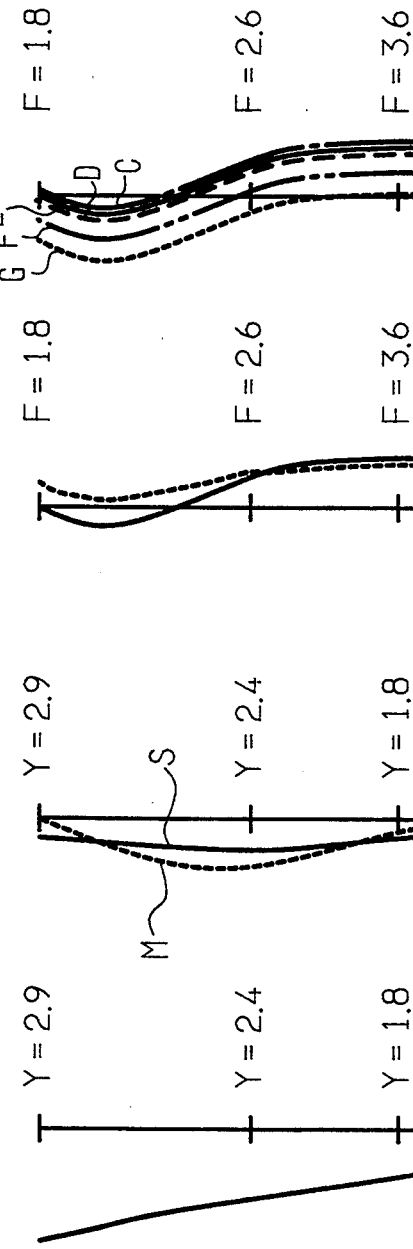
FIG. 4 is a graph showing its characteristics.

The plastic lenses L1, to L4 are designed with constants or parameters indicated specifically in Table 1 and have the characteristics as shown in FIG. 4. A first lens L1 and a second lens L2 are concave lenses and a third lens L3 and a fourth lens L4 are convex lenses. Both front and rear surfaces #5 and #6 of the third lens L3 and a front surface #7 of the fourth lens L4 are made non-spherical. As shown in FIG. 2A (and also in FIG. 1A for a corresponding structure) lenses L1 to L4 are provided at their peripheral edge portions with ribs 21, 31, 41 and 51, respectively, which are fitted in the above lens receiving section 12 to maintain prescribed or predetermined distances between the lenses L1 to L4.

The solid-state image pickup device 6 is constituted by a substrate 62, a solid-state image pickup semiconductor chip 64 mounted on the substrate 62 and leads 61 for external connection attached on two sides of the substrate 62. The size of the chip 64 is set at $\frac{1}{3}$ inch in its diagonal line, for example.

Next, the construction of the lenses L1 to L4 will be explained with reference to FIGS. 3 and 4 and Tables 1 and 2.

Figure 3:
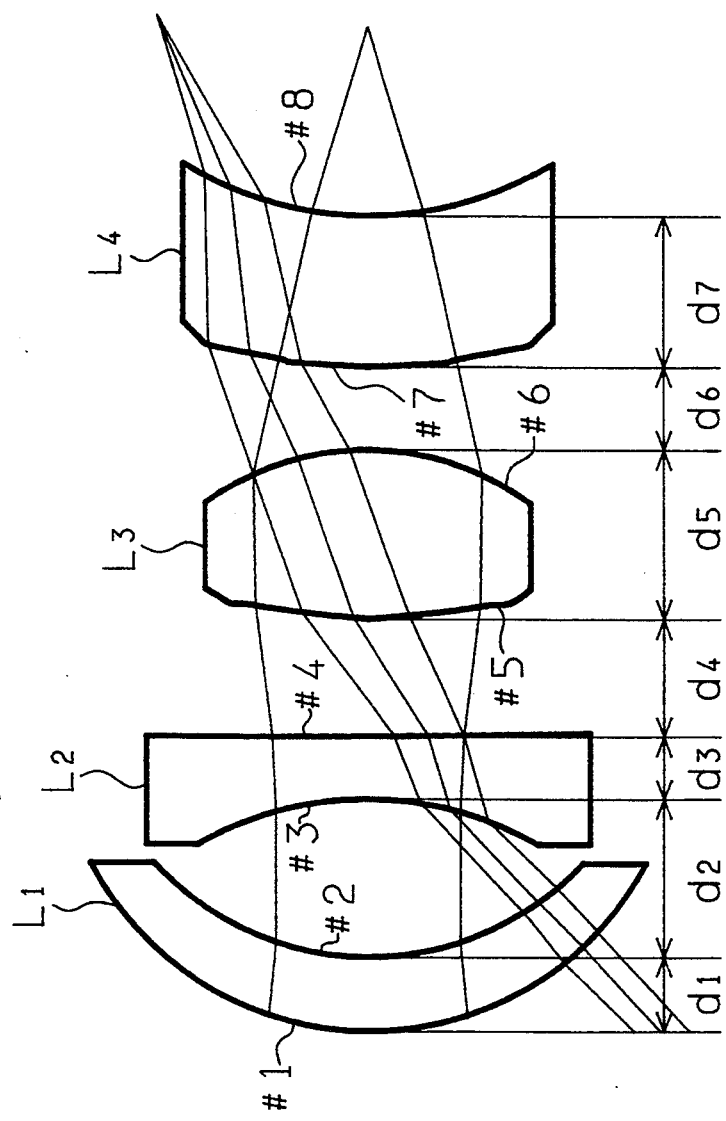
FIG. 3 is a view for explaining lens part used in the camera units shown in FIGS. 17 and 5.

FIG. 3 shows the detail of only the lenses L1 to L4 shown in FIG. 2A. In FIG. 3, reference characters #1 to #8 denote lens surface numbers in order from the left. Table 1 indicates one example of respective design parameters of the lens surface curvature radius γ, the distance d between the lens surfaces, the refraction index n and the dispersive power ν corresponding to the lens surfaces #1 to #8 and the lenses L1 to L4. The radius γ and the distance d are represented in a ratio to E.F.L. assuming that the effective focal length E.F.L. of the four lenses is set at 1.

In order to obtain a prescribed (predetermined) characteristic using a smaller number of lenses, it is preferred to adopt the following ideas.

① The first lens L1 is a meniscus positive lens with its convex surface (#1) facing the object side.

② The second lens L2 is a negative lens with both concave surfaces (#3, #4).

③ The third lens L3 is a non-spherical positive lens with both convex surfaces (#5, #6).

④ The fourth lens L4 is a meniscus positive lens with its non-spherical convex surface (#7) facing the object side.

The constants (parameters) of the respective lenses and lens surfaces may be preferably selected to satisfy the following conditions.

$$f1 > 50f \tag{1}$$

$$0.4f < d2 < 0.6f \tag{2}$$

$$1.0f < r3 \tag{3}$$

where f is an effective focal length of the lenses L1 to L4; f1 is an individual focal distance of the lens L1; d2 is a diameter between the lens surfaces #2 and #3; and r3 is a radium of curvature of the lens surface #3.

The above conditions are set for the following reasons.

With respect to the condition (1), if f1 < 50f, produced negative distortion aberration is large, and the curvature of field will be excessively corrected. A coma aberration will also be produced.

With respect to the condition (2), if the value of d2 is lower than the lower limit, an inward coma aberration will be produced, and if it exceeds the upper limit, an outward coma aberration will be produced.

With respect to the condition (3), if the value of r3 is lower than the effective focal length f and becomes close to the lower limit, negative distortion aberration will become larger.

The aberrations can be further preferably corrected with ease by forming the both surfaces of the third lens L3 and the surface of the fourth lense L4 facing the object side in the non-spherical shape as shown in this embodiment, in addition to the above conditions.

The respective aberration produced in this embodiment are shown in FIG. 4. In FIG. 4, reference characters D, G, C, F and E represent the spherical aberration and the chromatic aberration for D-, G-, C-, F and E-lines. Reference characters M and S denote a meridional section and a sagittal section.

As seen from the aberration curves shown in FIG. 4, the spherical aberration is satisfactorily corrected and hence flare with the lenses opened is very small. Further, as understood from Seidal aberration coefficients (Table 3), the coma aberration is satisfactorily corrected, thus providing improved imaging performance. The distortion aberration is large for the correction amount because of the essential purpose.

The lens surface #5 to #7 are formed in the non-spherical shape. The curvature radii γ asterisked by *1-*3 in Table 1 can be calculated using the data in Table 2 and the calculating method indicated below Table 2.

Incidentally, Tables 4 to 6 show the specifications of the examples of the lenses in case of a video camera unit having a viewing angle of 75°.

Embodiment 2

Figure 5:
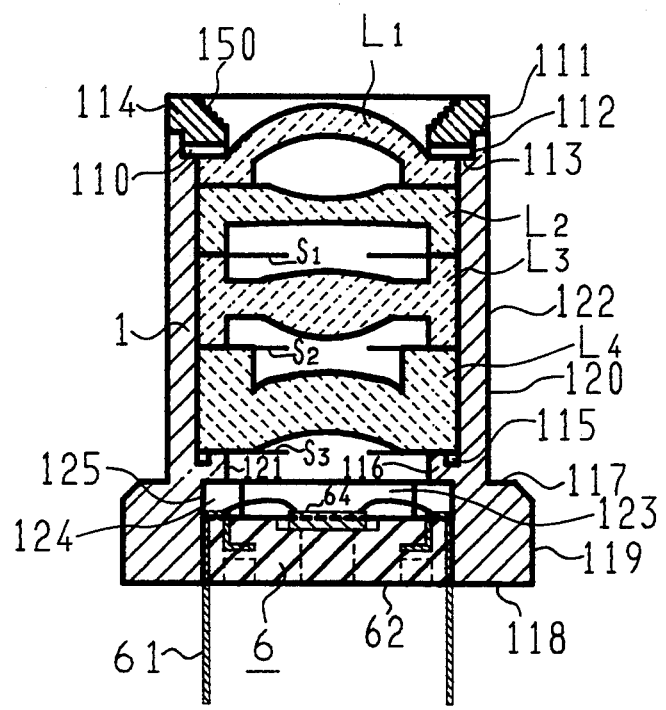
FIG. 5 is a sectional view of a video camera unit in accordance with still another embodiment of the present invention.
Figure 6:
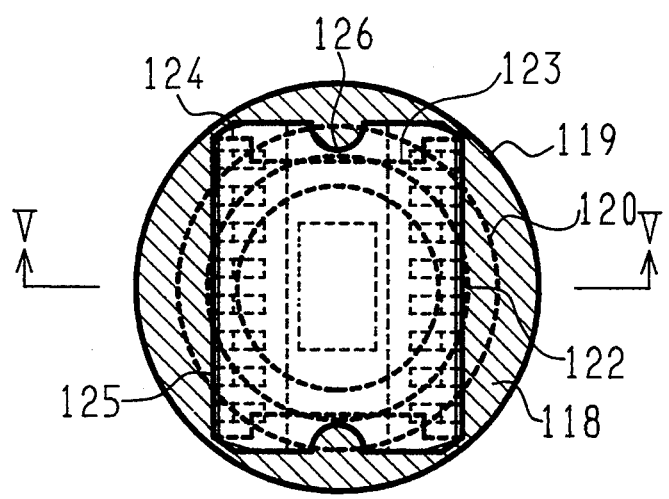
FIG. 6 is a plan view thereof.

FIG. 5 is a sectional view of a solid-state image unit according to another embodiment of the present invention and FIG. 6 is a plan view thereof when viewed from below (lenses L1 to L4, cover 114 and the upper end portion of the holder 1 being omitted). FIG. 5 shows a section taken along the line V—V in FIG. 6.

Reference numeral 114 denotes a cover assembled after lenses L1 to L4 are received in the lens holder 1. The upper end portion 111 of the lens holder 1 is formed to be higher than the edge portion of the lens L1, and a recess consisting of a vertical section 112 and a horizontal bottom section 113 is formed inside the upper end portion 111. The horizontal bottom section 113 is set at the level substantially the same as or slightly higher than the edge portion of the lens L1.

Provision of the step portion thus formed by the sectional 111 to 113 at the upper end portion of the lens holder 1 makes it easy to fix or fit the cover 114 in the holder 1 and also increases the bonding area of the cover 114 to the step portion 111 to 113 so as to increase the bonding strength. Further, the bottom of the cover 114 is kept into contact with both the edge portion of the lens L1 and the section 113 of the lens holder 1 by means of bonding agent, etc., thus providing a stabilized structure of the image pickup unit.

A recess 110 provided below the cover 114 is used as an injection opening for the bonding agent.

A projection 116 and a recess 115 are provided at the lower inside portion of the lens holder 1. The recess 115 serves as a drain opening for air extruded when the lenses L4 to L1 are successively piled so as to prevent the lenses L4 to L1 from being floating up due to air. The projection 116 is efficient in deciding the distance between the lowest lens L4 and the solid-state image pickup chip 64. The projection 116 also serves as a light shading member for preventing diffused reflection light from being incident to the chip 64 to cause a flare phenomenon. Reference characters S1 to S3 denote also dull black light shading plates formed in a doughnut shape for the same purpose.

A flat outward projection 117, which is provided at the lower part of the lens holder 1, can be used as a stopper when the imaging unit is inserted into a hole provided in a camera body.

An inside inclined surface 150 of the cover 114, which is formed stepwise, serves to diffusely reflect unnecessary light projected thereto to the outside.

A solid-state image pickup device 6 is fitted into the holder 1 along the lower side inner wall 125 thereof. In this case, a semicircular portion 126 projected on the bottom surface of the holder 1 serves as a guide. The plastic substrate 62 of the device 6 also has a complementary semicircular concave portion in accordance with the shape of the semicircular portion 126. The bottom 118 of the holder 1 is hatched for the convenience of clarity in the plan view of FIG. 6.

Thus, although the device 6 is positioned in the horizontal plane (X and Y directions) by means of the inner walls 125 and 126 of the holder 1, in the vertical direction (Z direction) it is positioned by step portions 123 and 124 located slightly behind from the bottom of the holder 1 (in FIG. 5) to decide the focusing distance of the lenses L1 to L4 for the image pickup chip 64. In the plan view of FIG. 6, the step portions 123 and 124 are provided at two upper and lower positions. Namely, steps are formed at boundaries 123 and 124. Since the step portions 123 and 124 are in contact with a portion of the upper surface of a package 62 where no lead 61 is provided, the thickness and bending of the lead 61 do not influence the distance accuracy between the lenses and the image pickup chip.

Embodiment 3

Figure 7:
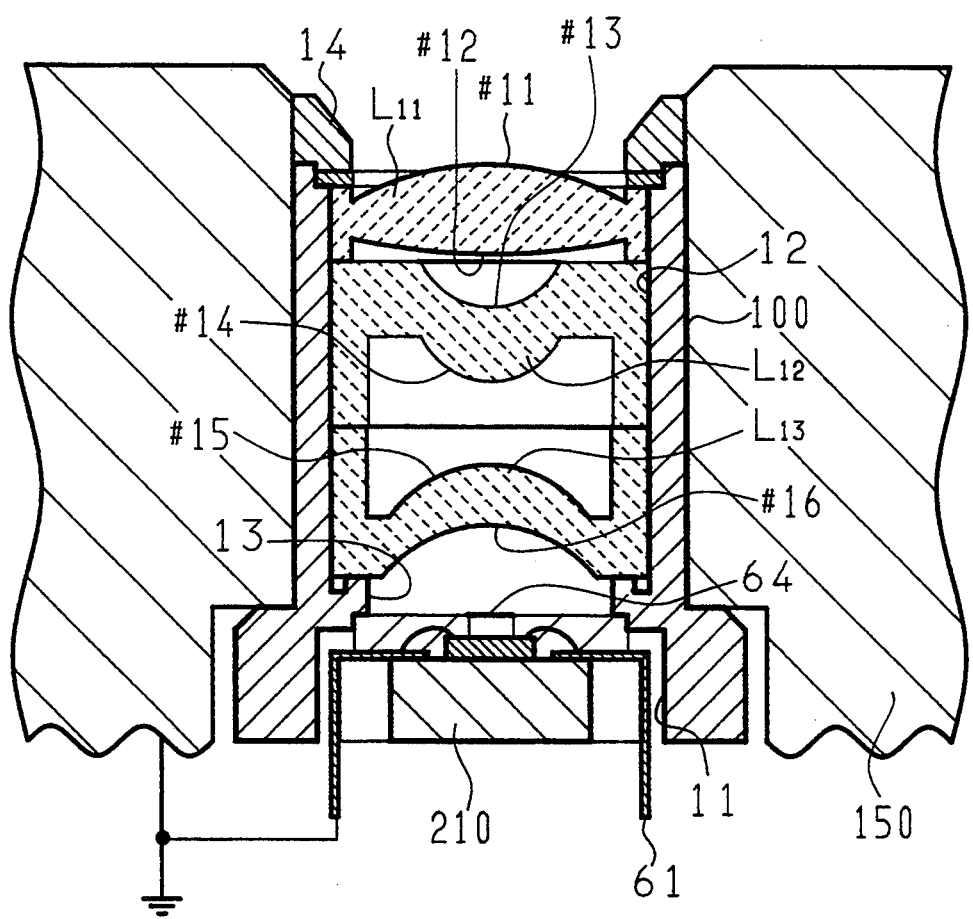
FIG. 7 is a sectional view of a video camera unit in accordance with a further embodiment of the present invention.

FIG. 7 is a sectional view of a video camera unit according to still another embodiment of the present invention.

One feature of this embodiment different from the embodiments of FIGS. 17 and 5 is that the viewing angle which is not a wide angle but a normal angle is adopted, thereby decreasing the total number of lenses that need to be used by one, i.e., three lenses being used, to allow cost reduction.

A lens L11 is a positive lens with both convex surfaces (#11, #12); a lens L12 is a meniscus positive lens with one concave surface #13 facing a subject and another non-spherical surface #14 on the image pickup device side; and a lens L13 is a meniscus positive lens with one non-spherical surface #15 on the subject side.

Figure 8:
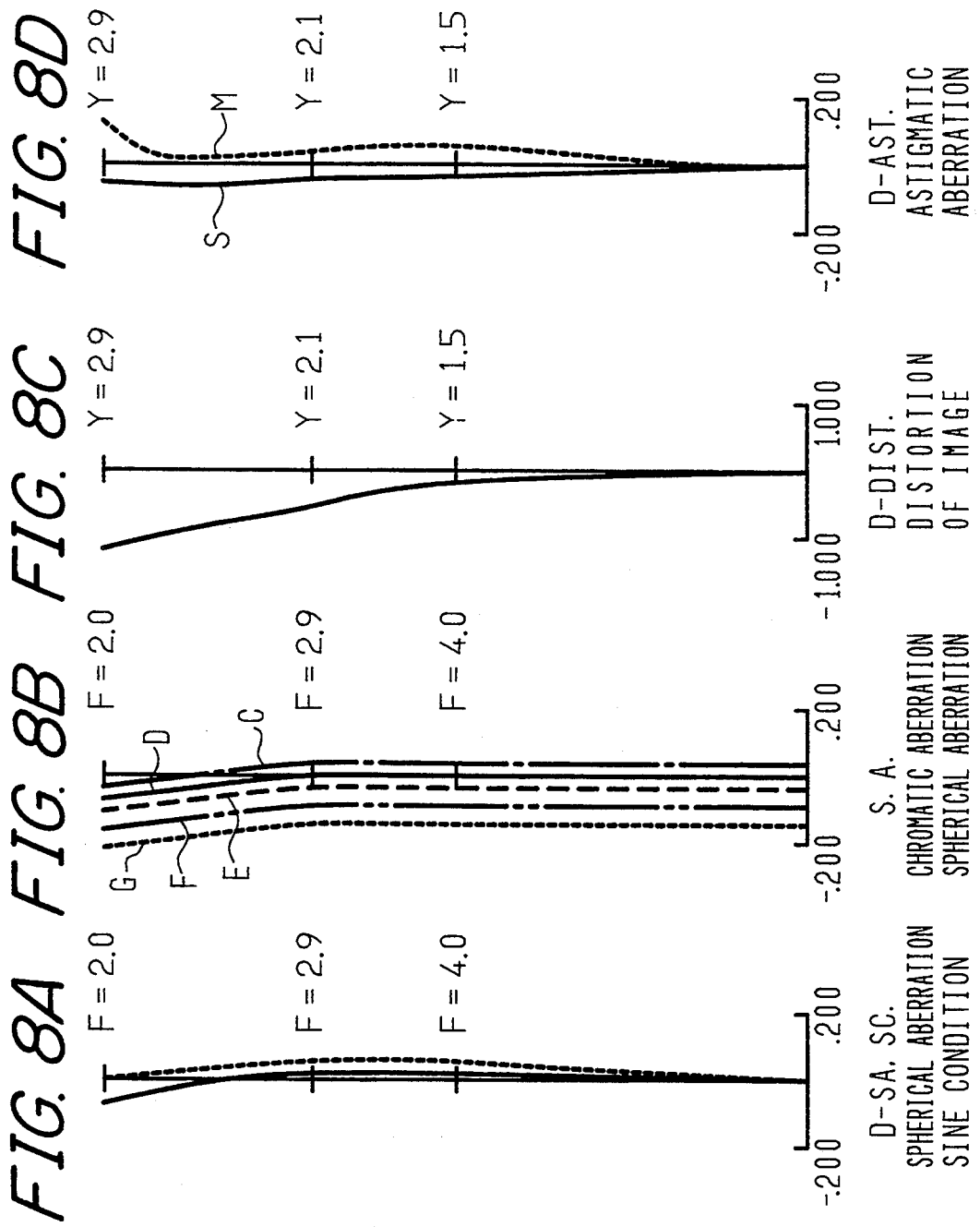
FIG. 8 is a graph showing the characteristic of a lens used in the video camera unit of FIG. 7.

The constants (parameters) of the respective lens surfaces are indicated in Table 7, the constants of the respective non-spherical lens surfaces are indicated in Table 8 and several characteristics such as the Seidel aberration coefficients of the respective lens surfaces are shown in Table 9 and FIG. 8. The respective symbols and the subscripts of asterisks therefor, which have the same meanings as in the embodiment of FIG. 3, will not be further explained.

The optimum design constants of the respective lenses and lens surfaces are as follows.

$$f2 > 0 \quad (4)$$

$$r6 > 0 \quad (5)$$

$$0.25 < d4 < 0.35 \quad (6)$$

$$f3 > f2 > f1 > 0 \quad (7)$$

$$r4 > 0 \quad (8)$$

If such conditions are adopted, as seen from the aberration curves of FIG. 8, the higher order spherical aberration and coma aberration are satisfactorily corrected and so flare with the lenses opened is very small. Further, as understood from the Seidel coefficients indicated in Table 9, the coma aberration is satisfactorily corrected, thus providing improved imaging performance.

Another feature of this embodiment resides in that the image pickup device 64 is electrostatically shielded from the outside by a holder 100 containing carbon.

The holder 100 can be fabricated by mixing a suitable amount of glass into polycarbonate resin, mixing carbon thereinto in the ratio of 10 to 20% of the whole material and transfer-molding the resin.

The holder 100 is A.C. grounded together with the lead 61 of the solid-state image pickup device 64 through a chassis 150 of a camera body when the video camera unit is attached to the camera body.

In place of carbon, silver particles may be used as material to be contained in the material of the holder 100.

The above TV camera unit can be miniaturized so as to have the overall length and the maximum diameter of about 15 mm, respectively. Further, wide angle, standard and telescope optical systems can be constructed such that, for example, the focal length is set to be f=3.6 to 5.2 mm (wide angle), f=5.3 to 8.3 mm (standard), and f=15 mm (telescope), F number for the brightness is decided to be F=1:1.6 to 2.2, and the view angle is set to be 60° to 90° (wide angle), 40° to 60° (standard) and 15° to 40° (telescope).

Embodiment 4

The solid-state image pickup chip 64 is designed to provide an electrically variable sensitivity and, to this end, it has a function of electrically adjusting the diaphragm or shutter speed. This is very convenient for the fixed lens system mentioned above. Now referring to FIG. 9, an internal circuit of the chip 64 will be explained and, referring to FIG. 10, a block arrangement of the entire image pickup (camera) circuit will be explained.

Figure 9:
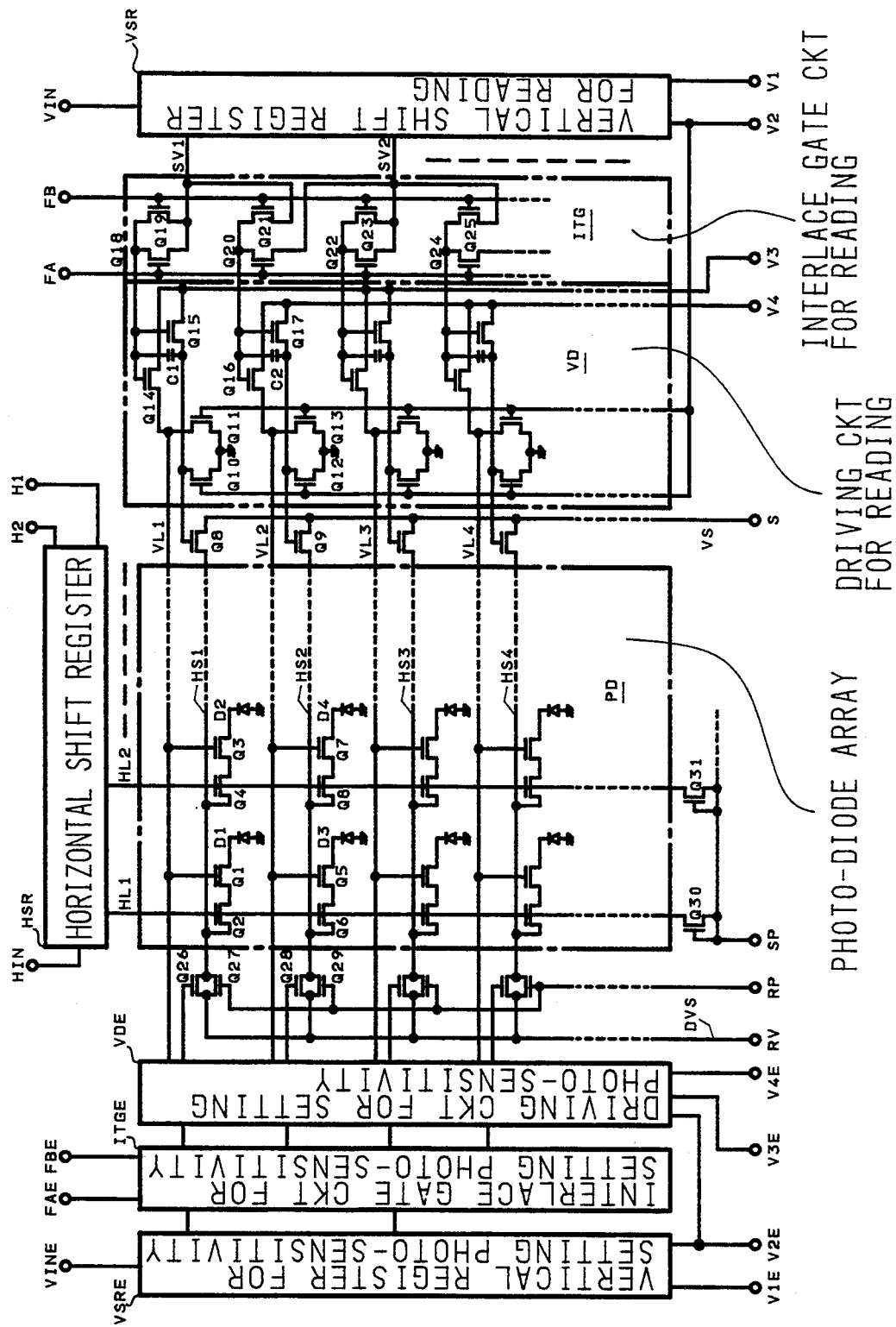
FIG. 9 is a circuit diagram showing a principal part of one embodiment of an internal circuit of a solid-state image pickup chip in accordance with the present invention.

FIG. 9 is a circuit diagram showing essential portions of one example of a TSL (Transversal Signal Line) system solid-state imaging device to which the present invention is applied. The circuit elements shown in FIG. 9 are fabricated on a single semiconductor substrate such as single crystal silicon by a known semiconductor integrated circuit manufacturing technique, although not necessarily limited thereto. Principal circuit blocks shown in the figure are drawn in conformity with the actual geometrical layout on a semiconductor chip.

Symbols "○" in upper and lower regions in the figure represent signal terminals which are electrically connected with the leads 61 of the device 6 shown in FIGS. 17 and 2. Although sixteen (16) leads 61 are shown in FIGS. 17 and 2 for the sake of convenience, twenty-four (24) such leads may be used in conformity to the internal circuit of the chip shown in FIG. 9 (so called 24 pin DIL package).

Concerning a picture element array PD, a part of the array PD which consists of four rows (lines) and two columns is representatively illustrated. In order to prevent complication of the illustration, circuit symbols are put only to picture element cells for two rows among the four rows. One picture element cell is defined by a series circuit which comprises a photodiode D1, a switching MOSFET Q1 having its gate coupled to a vertical scanning line VL1, and a switching MOSFET Q2 having its gate coupled to a horizontal scanning line HL1. The respective output nodes of the other similar picture element cells (D2, Q3, Q4 . . . ) which are disposed along the same row (in the horizontal direction) as the picture element cell composed of the photodiode D1 and the switching MOSFETs Q1 and Q2 are coupled to a horizontal signal line HS1 which extends horizontally as viewed in the figure. Similarly, picture element cells which are the same as the above are coupled in regard to the other rows.

The horizontal scanning line HL1 which is exemplarily illustrated extends verifically as viewed in the figure and is coupled in common to the gates of switching MOSFETs Q2, Q6 . . . of picture element cells which are disposed along the same column. Picture element cells which are disposed along the other columns are also coupled to the corresponding horizontal scanning lines HL2 . . . in the same way as the above.

In this embodiment, switching MOSFETs Q8, Q9 and Q26, Q28 are provided at both ends, respectively, of the horizontal signal lines HS1 to HS4 . . . which constitute the picture element array PD, in order to add a virtual automatic electronic diaphragm function to the solid-state imaging device, that is, in order to make variable the substantial storage time with respect to the photodiodes. The switching MOSFETs Q8 and Q9 which are disposed at the right-hand end operate so as to couple the respective horizontal signal lines HS1 and HS2 to an output line VS which extends vertically. The output line VS is coupled to a terminal S through which a read-out signal is transmitted to the input terminal of a preamplifier which is externally provided. The switching MOSFETs Q26 and Q28 which are disposed at the left-hand end operate so as to couple the respective horizontal signal lines HS1 and HS2 to a dummy (reset) output line DVS which extends vertically. Although not necessarily limitative, the output line DVS is coupled to a terminal RV so that it is possible to deliver from the external terminal RV a signal on the dummy output line DVS if desired.

In this embodiment, the horizontal signal lines HS1 to HS4 for the exemplarily illustrated four rows are respectively provided with switching MOSFETs Q27, Q29 which are turned ON in response to a reset signal that is supplied from a terminal RP during the horizontal blanking period, although not necessarily limitative thereto. When the MOSFETs Q27, Q29 . . . are turned ON, a predetermined bias voltage (not shown) is applied to each of the horizontal signal lines HS1 to HS4 from the external terminal RV through the dummy output line DVS. The reason why the resetting MOSFETs Q27, Q29 . . . are provided is as follows. Semiconductor regions such as the drains of the switching MOSFETs which are coupled to the horizontal signal lines HS1 to HS4 may also have sensitivity to light, and therefore false signals (which may cause smear or blooming) formed by such parasitic photodiodes may be accumulated on the horizontal signal lines which are floating when they are in the non-selected state. Therefore, in this embodiment, all the horizontal signal lines HS1 to HS4 are reset to said predetermined bias voltage by making use of the horizontal blanking period as described above. Thus, in regard to each of the selected horizontal signal lines, a picture signal is always taken out in a state wherein the above-described false signals are reset, and it is therefore possible to greatly reduce false signals contained in the output picture signal. It should be noted that the false signals (causing smear or blooming) are described in detail, for example, in Japanese Patent Unexamined Publication No. 57-17276.

The horizontal scanning lines HL1, HL2 . . . are supplied with a horizontal scanning signal which is formed in a horizontal shift register HSR.

The scanning circuit which effects a vertical selection operation (i.e., horizontal scanning operation) in the above-described picture element array PD is composed of the following circuits.

In this embodiment, a pair of scanning circuits are provided in conformity with the provision of the pairs of switching MOSFETs Q8, Q9 . . . and Q26, Q28 . . . at both ends of the horizontal signal lines HS1 to HS4 . . . in the picture element array PD.

In order to enable application to industrial uses, this embodiment is arranged so that it is possible to effect scanning processes or modes in addition to the interlaced scanning, i.e., a scanning process in which two rows can be selected simultaneously, and a non-interlaced scanning process. The following scanning circuit is provided at the right-hand side of the picture element array PD. Namely, a vertical shift register VSR forms output signals SV1, SV2 . . . which are employed for reading. These output signals SV1, SV2 are supplied to the vertical scanning lines VL1 to VL4 and also to the gates of the switching MOSFETs Q8, Q9 through an interlace gate circuit ITG and a driver circuit VD.

The interlace gate circuit ITG operates in the following manner in order to effect a vertical selection operation (i.e., horizontal scanning operation) in the interlace mode. Namely, in the case of a first (odd-number) field, the vertical scanning lines VL1 to VL4 are selected in such a manner that a combination of adjacent vertical scanning lines, i.e., one scanning line VL1 and a pair of adjacent vertical scanning lines VL2 and VL3, are simultaneously selected. More specifically, the output signal SV1 from the vertical shift register VSR is delivered to the vertical scanning line VL1 for selecting the horizontal signal line HS1 by the operation of a switching MOSFET Q18 which is controlled by an odd-number field signal FA. Similarly, the output signal SV2 from the vertical shift register VSR is delivered to both the vertical scanning lines VL2 and VL3 so as to simultaneously select the horizontal signal lines HS2 and HS3 by the operation of switching MOSFETs Q20 and Q22 controlled by the signal FA. Thereafter, selection signals for selecting a pair of horizontal signal lines which are combined according to the same sequence as the above are formed.

In the case of a second (even-number) field, the vertical scanning lines VL1 to VL4 are selected in such a manner that a combination of adjacent vertical scanning lines, i.e., two-pairs of vertical scanning lines VL1, VL2 and VL3, VL4 are simultaneously selected. More specifically, the output signal SV1 from the vertical shift register VSR is delivered to the vertical scanning lines VL1 and VL2 for selecting the horizontal signal lines HS1 and HS2 by the operation of switching MOSFETs Q19 and Q21 which are controlled by an even-number field signal FB. Similarly, the output signal SV2 from the vertical shift register VSR is delivered to the vertical scanning lines VL3 and VL4 so as to simultaneously select the horizontal signal lines HS3 and HS4 by the operation of switching MOSFETs Q23 and Q25 which are controlled by the signal FB. Thereafter, selection signals for selecting a pair of horizontal signal lines which are combined according to the same sequence as the above are formed.

A plurality of different kinds of horizontal scanning operation which will be explained hereinafter are realized by a combination of the above-described interlace gate circuit ITG and he drive circuit DV described above.

The output signal from the interlace gate circuit ITG which corresponds to the above-described one vertical scanning line VL1 is supplied to the gates of switching MOSFETs Q14 and Q15. The common drain electrode of these switching MOSFETs Q14 and Q15 is coupled to a terminal V3. The switching MOSFET Q14 supplies a signal supplied thereto from the terminal V3 to the vertical scanning line VL1. The switching MOSFET Q15 supplies a signal supplied thereto from the terminal V3 to the gate of the switching MOSFET Q8 which couples the horizontal signal line HS1 to the output line VS. In order to prevent the high level of the output signal from lowering by an amount corresponding to the threshold voltage of the switching MOSFETs Q14 and Q15, a capacitor C1 is provided between the gate of the MOSFET Q14 and the output side (source side) of the MOSFET Q15, although not necessarily limitative thereto. Thus, when the output signal from the interlace gate circuit ITG is raised to the high level, the potential at the terminal V3 is maintained at the low level and in the meantime the capacitor C1 is precharged. When the potential at the terminal V3 is raised to the high level thereafter, the gate voltage of the MOSFETs Q14 and Q15 can be raised by the bootstrap action by the capacitor C1.

The output signal from the interlace gate circuit ITG which corresponds to the vertical scanning line VL2 which is adjacent to the above-described vertical scanning line VL1 is supplied to the gates of switching MOSFETs Q16 and Q17. The common drain electrode of these switching MOSFETs Q16 and Q17 is coupled to a terminal V4. The switching MOSFET Q16 supplies a signal supplied thereto from the terminal V4 to the vertical scanning line VL2. The switching MOSFET Q17 supplies a signal supplied thereto from the terminal V4 to the gate of the switching MOSFET Q9 which couples the horizontal signal line HS2 to the output line VS. In order to prevent the high level of the output signal from lowering by an amount corresponding to the threshold voltage of the switching MOSFETs Q16 and Q17, a capacitor C2 is provided between the gate of the MOSFET Q16 and the output side (source side) of the MOSFET Q17, although not necessarily limitative thereto. Thus, the gate voltage of the MOSFETs Q16 and Q17 can be raised by the bootstrap action by the capacitor C2 by changing the potential at the terminal V4 at the same timing as that described above.

The terminal V3 is provided in common to switching MOSFETs for driving which are provided in correspondence with odd-number vertical scanning lines (horizontal signal lines), while the terminal V4 is provided in common to even-number vertical scanning lines (horizontal signal lines).

As will be understood from the foregoing, it is possible to effect a reading operation in the interlace mode by combining together the operation of alternatively supplying timing signals to the terminals V3 and V4 and the operation of selecting two rows simultaneously which is effected by the interlace gate circuit ITG. For example, if, in the case of an odd-number field FA, the terminal V3 is supplied with a timing signal synchronized with the operation of the vertical shift register VSR with the terminal V4 placed at the low level, the vertical scanning lines (horizontal signal lines) can be selected in the following sequence: VL1 (HS1), VL3 (HS3) . . . . In the case of an even-number field FB, the terminal V4 is supplied with a timing signal synchronized with the operation of the vertical shift register VSR with the terminal V3 placed at the low level, and it is thereby possible to select the vertical scanning lines (horizontal signal lines) in the following sequence: VL2 (HS2), VL4 (HS4) . . . .

On the other hand, if the terminals V3 and V4 are simultaneously raised to the high level in the same manner as the above, a scanning process in which a pair of rows (lines) are simultaneously selected can be effected in accordance with the output signals from the interlace gate circuit ITG. In this case, since the combination of pairs of rows which are selected for each of the two fields in accordance with the field signals FA and FB is shifted vertically by an amount corresponding to one row (line) as described above, it is possible to realize a vertical shift of spatial centroid, that is, an equivalent interlace mode.

If, for example, the signal FB alone is raised to the high level, and the horizontal shift register HSR is operated twice in response to one vertical scanning timing to raise the terminals V3 and V4 to the high level synchronously therewith, it is possible to realize a selection operation in the non-interlace mode in which the vertical scanning lines are selected in the following sequence: VL1, VL2, VL3, VL4 . . . . In this case, it is preferable to double the frequency of the clock signals which are supplied to the horizontal shift register HSR and the vertical shift register VSR with a view to improving the picture quality. More specifically, if the frequency of the clock signals which are supplied to the horizontal and vertical shift registers HSR and VSR from terminals H1, H2 and V1, V2 is doubled, it is possible to read sixty (60) pictures per second in the non-interlace mode. It should be noted that terminals HIN and VIN serve to supply input signals which are to be shifted by the shift registers HSR and VSR, respectively, the shift operation of each shift register being started from the time when the input signal is supplied thereto. Accordingly, in the case where the above-described double-row simultaneous reading scanning, interlaced scanning, non-interlaced scanning and the like are effected in accordance with the combination of input signals supplied to the interlace gate circuit ITG and the input terminals V3, V4, timing must be taken into consideration when the input signal is supplied to the shift register VSR so that the positional relationship between output signals in the vertical direction will now be reversed.

Resetting MOSFETs Q10 and Q11 are respectively provided between the vertical scanning line VL1, the gate of the switching MOSFET Q8 corresponding thereto, and the ground potential point of the circuit. These resetting MOSFETs Q10 and Q11 are supplied with the clock signal from the terminal V2, the clock signal being supplied in common to all resetting MOSFETs provided in correspondence with the other vertical scanning lines and their corresponding switching MOSFETs, and the MOSFETs Q10 and Q11 operate to quickly drop the potential of the vertical scanning line in a selected state and the gate potential of the corresponding switching MOSFET to the low level.

In this embodiment, as described above, a vertical shift register VSRE, an interlace gate circuit ITGE and a driver circuit DVE for sensitivity control are additionally provided in order to add a variable sensitivity function. These circuits for sensitivity control are disposed on the left-hand side of the picture element array PD, although not necessarily limitative thereto. The vertical shift register VSRE, interlace gate circuit ITGE and driver circuit DVE have circuit configurations similar to those of the above-described vertical shift register VSR, interlace gate circuit ITG and driver circuit DV for reading. Timing signals which are similar to those above are supplied from terminals V1E to V4E, VINE, FAE and FBE, respectively. In this case, the terminals V1E and V1 and the terminals V2E and V2 are supplied with the same clock signals, respectively, in order to allow the vertical shift register VSR for reading and the vertical shift register VSRE for varying sensitivity to make the shift operation synchronously with each other, although not necessarily limitative thereto. Accordingly, the terminals V1E and V1 and the terminals V2E and V2 may be made common to each other, respectively, by an internal circuit. The reason why the independent terminals V1E and V2E are provided as described above is to enable this solid-state imaging device to be applied to television cameras having manually-operated diaphragms or a conventional mechanical diaphragm function. Thus, consideration is taken so that, when no sensitivity-varying operation is effected, the terminals V1E and V2E are placed at a low level such as the ground potential of the circuit to thereby prevent electric power from being wastefully consumed in the vertical shift register VSRE.

The following is a description of the sensitivity control operation of the solid-state imaging device in accordance with this embodiment.

To facilitate the explanation, the vertical scanning operation in the above-described non-interlace mode will be taken as an example in the following description. For example, the vertical shift register VSRE, interlace gate circuit ITGE and driver circuit DVE for sensitivity control are made to effect a select operation for the fourth row (the vertical scanning line VL4; the horizontal signal line HS4) in parallel to the reading operation for the first row (the vertical scanning line VL1; the horizontal signal line HS1) effected by the vertical shift register VSR, interlace gate circuit ITG and driver circuit DV for reading. Thus, optical signals accumulated in the photodiodes D1, D2 . . . in the first row are read out to the output signal line VS in time sequence in synchronism with the selection operation for the horizontal scanning lines HL1, HL2 . . . formed by the horizontal shift register HSR. This reading operation is carried out by the supply of a current corresponding to each of the optical signals from the terminal S through a load resistor, and the precharge (reset) operation is carried out simultaneously with the reading operation. A similar operation is also effected for the photodiodes disposed along the fourth row. In this case, the reading operation for the fourth row is effected with respect to the dummy output line DVS by the above-described scanning circuit (VSRE, ITGE and DVE) for sensitivity control. In the case where the sensitivity control operation alone is conducted, the terminal RV is supplied with the same bias voltage as that applied to the terminal S. Thus, the optical signal which has already been accumulated in each of the picture element cells disposed along the fourth row is swept out, that is, a reset operation is effected.

Accordingly, the reading operation for the fourth row (the vertical scanning line VL4; the horizontal signal line HS4) by the vertical shift register VSR, interlace gate circuit ITG and driver circuit DV for reading is carried out after the reading operation for the first to third lines by the above-described vertical scanning operation. Therefore, the storage time of the photodiode in each of the picture element cells disposed along the fourth row is equal to the time which is required to read all the picture element cells for the three rows.

In place of the above-described operation, the vertical shift register VSRE, interlace gate circuit ITGE and driver circuit DVE for sensitivity control are made to effect a selection operation for the second row (the vertical scanning line VL2; the horizontal signal line HS2) in parallel to the reading operation for the first row (the vertical scanning line VL1; the horizontal signal line HS1) effected by the vertical shift register VSR, interlace gate circuit ITG and driver circuit DV for reading. Thus, optical signals accumulated in the photodiodes D1, D2 . . . in the first row are read out to the output signal line VS in time sequence in synchronism with the selection operation for the horizontal scanning lines HL1, HL2 . . . formed by the horizontal shift register HSR. This reading operation is carried out by the supply of a current corresponding to each of the optical signals from the terminal S through a load resistor, and the precharge (reset) operation is carried out simultaneously with the reading operation. A similar operation is also effected for the photodiodes D3, D4 . . . which are disposed along the second row. Thus, the optical or photo signal which has already been accumulated in each of the picture element cells disposed along the second row is swept out in parallel to the reading operation for the first row. Accordingly, the reading operation for the second row (the vertical scanning line VL2; the horizontal signal line HS2) by the vertical shift register VSR, interlace gate circuit ITG and driver circuit DV for reading is carried out after the reading operation for the first row by the above-described vertical scanning operation. Therefore, the storage time of the photodiode in each of the picture element cells disposed along the second row is equal to the time which is required to read all the picture element cells for one row. Thus, the virtual storage time of the photodiodes can be reduced to one third of that in the case of the above, that is, it is possible to lower the sensitivity to one third of that in the above-described case.

As described above, the picture element cells disposed along a particular row are reset by the preceding vertical scanning operation carried out by the scanning circuit for sensitivity control. Therefore, the time interval from the reset operation to the start of the actual reading operation carried out by the scanning circuit for reading is determined to be a storage time for the photodiodes. Accordingly, in a picture element array consisting of 525 rows (lines), it is possible to set a storage time over a considerably wide range, i.e., in 525 steps at maximum with the read time for one row as a unit (minimum storage time), that is, it is possible to set sensitivity at any of 525 levels, by the different addressing operations conducted by the above-described two vertical scanning circuit sand the picture element cell selection operation conducted by the common horizontal scanning circuit. However, it is assumed that variations in the illuminance at the light-receiving surface may be neglected with respect to the scanning time for the above-described one frame and substantially constant light is incident on the photodiodes. It should be noted that the highest sensitivity (525) is obtained when the scanning circuit for sensitivity control is in an inoperative state.

In the sensitivity control operation as described above, the reading operation of the picture element signals and the reset operation thereof by the preceding vertical scanning operation are parallely carried out. Then, the picture element signals for the reset operation may be mixed into the read signals due to capacitive coupling through the substrate, etc. Such capacitive coupling will provide noise, such as ghost in a television receiver, to the read picture element signals, thereby deteriorating the resultant image quality.

In order to overcome this, this embodiment adopts a function of forcibly placing all the horizontal scanning lines in their selected state for the above horizontal scanning lines HL1, HL2, etc. from the external terminal SP through MOSFETs Q30, Q31, etc. in diode connection. More specifically, when the above terminal SP is set or placed in the high level, all the MOSFETs Q30, Q31, etc. in a diode manner turn on regardless of the operation of the horizontal shift register HSR to provide the high level to all the horizontal scanning lines such as HL1, HL2, etc., thereby placing them in their selected state. On the other hand, when the above terminal SP is placed in the low level, the MOSFETs Q30, Q31, etc. maintain their off-state since the above selection level is supplied through uni-directional elements such as the MOSFETs Q30, Q31 etc. in the form of a diode. Thus, the provision of the above forcible simultaneous section circuit does not hinder the horizontal scanning lines HL1, HL2, etc. from being placed in the selection level in time sequence in accordance with the shift operation of the horizontal shift register HSR. Further, in order that the shift operation is not adversely affected by the forcible selection level of the horizontal scanning lines HL1, HL2, etc. because the horizontal shift register HSR is formed in a dynamic type circuit or the like, a switch circuit or the like for preventing the above selection level from being delivered to the interior of the horizontal shift register HSR may be additionally provided.

The simultaneous selection operation of the horizontal scanning lines HL1, HL2, etc. is carried out during the horizontal blanking period described later and also the preceding vertical scanning is started. Thus, the signals of all the picture elements on the row to be reset can be previously reset by force. Therefore, in reading picture element signals, the picture element signals are not substantially provided from the preceding row because of the selection operation of the horizontal scanning lines by the horizontal shift register HSR. Then, even if there is some capacitive coupling through the substrate or the like, the read signals do not provide the undesired noise as mentioned above.

Figure 10:
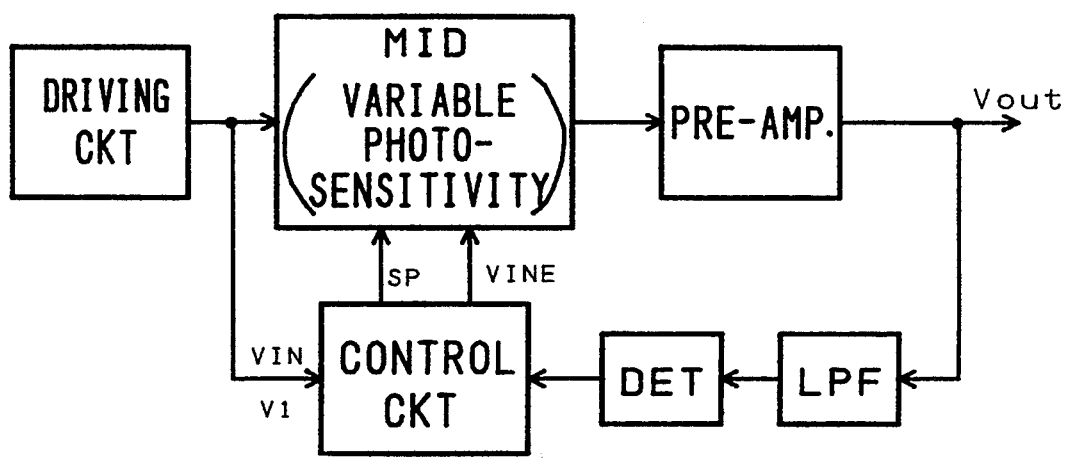
FIG. 10 is a block diagram showing one embodiment of an image pickup apparatus having the solid-state image pickup chip.

FIG. 10 shows a block diagram of one embodiment of an image pickup apparatus with an automatic diaphragm function including the above solid-state imaging device.

The solid-state imaging device MID had a sensitivity control or variable sensitivity function as previously explained with reference to FIG. 9. The read signal from the solid-state imaging device MID is amplified by a preamplifier (pre-amp). The amplified signal Vout from the preamplifier is, one one hand, supplied to a signal processing circuit which is not shown, as a television image signal for example. The amplified signal Vout is, on the other hand, used for automatic diaphragm control. More specifically, the above amplified signal Vout is supplied to a low-pass filter LPF so as to be converted into the average signal level thereof. This signal, although not limitative, is supplied to a detection circuit DET so as to be converted into a D.C. signal. A sensitivity control circuit receives the output signal from the detection circuit DET and compares it with a desired diaphragm amount to produce a control signal corresponding to an optimum diaphragm amount. Namely, the sensitivity control circuit receives the signals VIN, V1, etc. from a driving circuit which supplies to the solid-state imaging device MID clock signals for controlling the scanning timings as mentioned above, and produces, referring to the reading timings of the solid-state imaging device MID, a signal VINE substantially preceding thereto. In other words, the preceding timing signal VINE corresponding to a necessary diaphragm amount (sensitivity) is produced referring to the timing signal VIN so that the signal VINE is actually produced later than the timing signal VIN. However, since the scanning is repeatedly carried out, the signal VINE is regarded to be earlier than the signal VIN in the subsequent scanning of the frame. For example, if the timing signal VINE is produced later than the timing signal VIN by the time corresponding to one row, in the subsequent scanning frame, the timing signal VINE is regarded to be earlier than the timing signal VIN by the time corresponding to 524 rows. Since the shifting operation in the respective vertical shift-registers VSR and VSRE is started using the above timing signals VIN and VINE, the sensitivity control operation as previously mentioned will be carried out.

The sensitivity control circuit changes the diaphragm amount step by step in accordance with the comparison result of a reference voltage corresponding to a desired diaphragm amount with the output voltage from the detection circuit DET by, for example, a voltage comparison circuit. In order to enhance the response, the sensitivity control circuit decides or determines the diaphragm amount in accordance with the output signal from the voltage comparison circuit in sequence from the most significant bit of a binary signal corresponding to 525 steps of the diaphragm amount. For example, using the diaphragm amount of about ½ (sensitivity of 256) as a reference, if the signal from the detection circuit DET is larger than the reference voltage, a diaphragm amount of ¼ (sensitivity of 128) is decided, and if it is smaller than the reference voltage, a diaphragm amount of ¾ (sensitivity of 384) is decided, and successively the half diaphragm amounts thereof are decided. Thus, an optimum diaphragm amount can be obtained out of 525 steps of the sensitivity by ten times setting operations. Assuming that the operation of setting the diaphragm amount, i.e., initialization operation (VINE) of the vertical shift register VSRE for sensitivity control is carried out during the vertical blanking period, the optimum diaphragm amount can be set in accordance with the signal reading operation from 10 fields.

The sensitivity control circuit produces the signal SP for the forcible resetting operation during the horizontal blanking period, although not necessarily limited thereto. In response to this signal SP, the sensitivity control circuit produces a signal for vertical selection on the preceding row during the horizontal blanking period.

In the image pickup apparatus according to this embodiment, a sensitivity control function is incorporated in the solid-state imaging device MID, and the above sensitivity control circuit is formed in a semiconductor integrated circuit since the level of the read-out signal from the device MID is decided to electrically control the sensitivity. Thus, the apparatus according to this embodiment can be made to be compact, light and very durable. It is suitable to a monitor camera which is located in the environment where no special operator is assigned and brightness changes day and night. The monitor camera can be made so compact that its presence is concealed.

FIG. 11 shows a timing chart of one exemplary reading operation in the above solid-state imaging device.

For example, when the vertical scanning line VL1 is at the high level, the reading operation on the first row is performed by successively raising the horizontal scanning lines HL1 to HLm to the high level in time sequence. In this way, the current flows in correspondence to the photo signal stored in the photodiode of the picture element cell successively selected so that the operation of reading from the selected picture element cell and the reset (precharge) operation for the subsequent reading operation are simultaneously carried out. The voltage signal generated by causing the photo current to flow through the load resistor is amplified by the preamplifier shown in FIG. 10 and outputted. Likewise, when the preceding vertical scanning line VLn is at the high level, the reset operation on the n-th row is carried out by the selection operation of the horizontal scanning lines HL1 to HLm in time sequence.

Upon completion of the reading and reset operations of the above pair of rows (1, n) the horizontal blanking period is initiated. During this horizontal blanking period, the vertical scanning lines VL1 and VLn are dropped from the high level to the low level, i.e., are switched to the non-selected state. And the terminal RP is raised to the high level and the resetting MOSFETs Q27, Q29, etc. are turned on. Thus, the reset of the above-mentioned false signals generated on the horizontal signal lines HS2, etc. in the non-selected state is performed. The terminal SP is also raised to the high level to forcibly place all the horizontal scanning lines HL1 to HLm in the selected state. Then, the vertical scanning line VLn+1 corresponding to the subsequent row which precedes for sensitivity control is also raised to the high level to be placed in the selected state. Thus, the reading (resetting) of all the picture elements on one row corresponding to the vertical scanning line VLn+1 for the sensitivity setting is carried out.

When upon completion of the horizontal blanking period, the reading operation of the second row is started. Then, the horizontal scanning lines HL1 to HLm are successively raised to the high level in time sequence to provide the above read signals on the horizontal signal line HS2. In this case, any signal is not provided in the horizontal signal line HSn+1 on the preceding (n+1)-th row because the forcible reset has just been performed. If it were provided, it is a negligibly minute signal. Therefore, even if there is capacitive coupling between both horizontal signal lines (HS1, HSn+1) through the substrate, etc. the swept signal by the reset operation does not leak to the read signal side. Accordingly, the forcible reset operation during the horizontal blanking period can provide read-out signals with high picture quality.

Functions and effects provided by this embodiment are as follows.

(1) There are provided a first scanning circuit which produces the signals on a plurality of two-dimensionally arranged picture element cells in time sequence and a second scanning circuit which performs the selection operation in the vertical scanning direction by an address distinct from the address in the vertical scanning direction selected by the first scanning circuit so that, by precedently operating the second scanning circuit, the sensitivity can be controlled. Further, there is provided an external terminal for simultaneously placing all the horizontal scanning lines, which serve to select the above two-dimensionally arranged picture element cells in their horizontal direction, in the selected state by force, so that simultaneous selection signals from the second scanning circuit and the external terminal permit all the picture element signals on the preceding row to be reset (swept away) during the horizontal blanking period. Thus, any substantial picture element signal is not produced on the horizontal signal line corresponding to the preceding vertical scanning line so that coupling noise can be removed from the read picture element signals.

(2) There is provided, in addition to a first scanning circuit which produces the signals on a plurality of two-dimensionally arranged picture element cells in time sequence, a second scanning circuit which performs the selection operation in the vertical scanning direction by an address distinct from the address in the vertical scanning direction selected by the first scanning circuit so that, by performing the vertical scanning by the above-mentioned second scanning circuit precedently to the vertical scanning by the first scanning circuit, the storage time of the photoelectric conversion device can be controlled in accordance with a time difference between the both vertical scannings.

(3) The above items (1) and (2) realize the solid-state imaging device which maintains the high picture quality and also has the sensitivity control function.

The invention devised by the present inventor has been concretely explained in connection with its embodiment. However, the present invention is not limited to the above embodiment but can be modified and changed in various forms without departing from its spirit and scope. For example, in the circuit of FIG. 9, the interlace gate circuit and the driver circuit may take various forms in accordance with the scanning systems used. Further, the vertical scanning line on the preceding row may be placed in the selected state only during the horizontal blanking period. In this case, only the horizontal signal corresponding to the row to be read provides a read-out signal so that production of the above-mentioned noise due to capacitive coupling can be completely avoided.

Embodiment 5

Figure 17A:
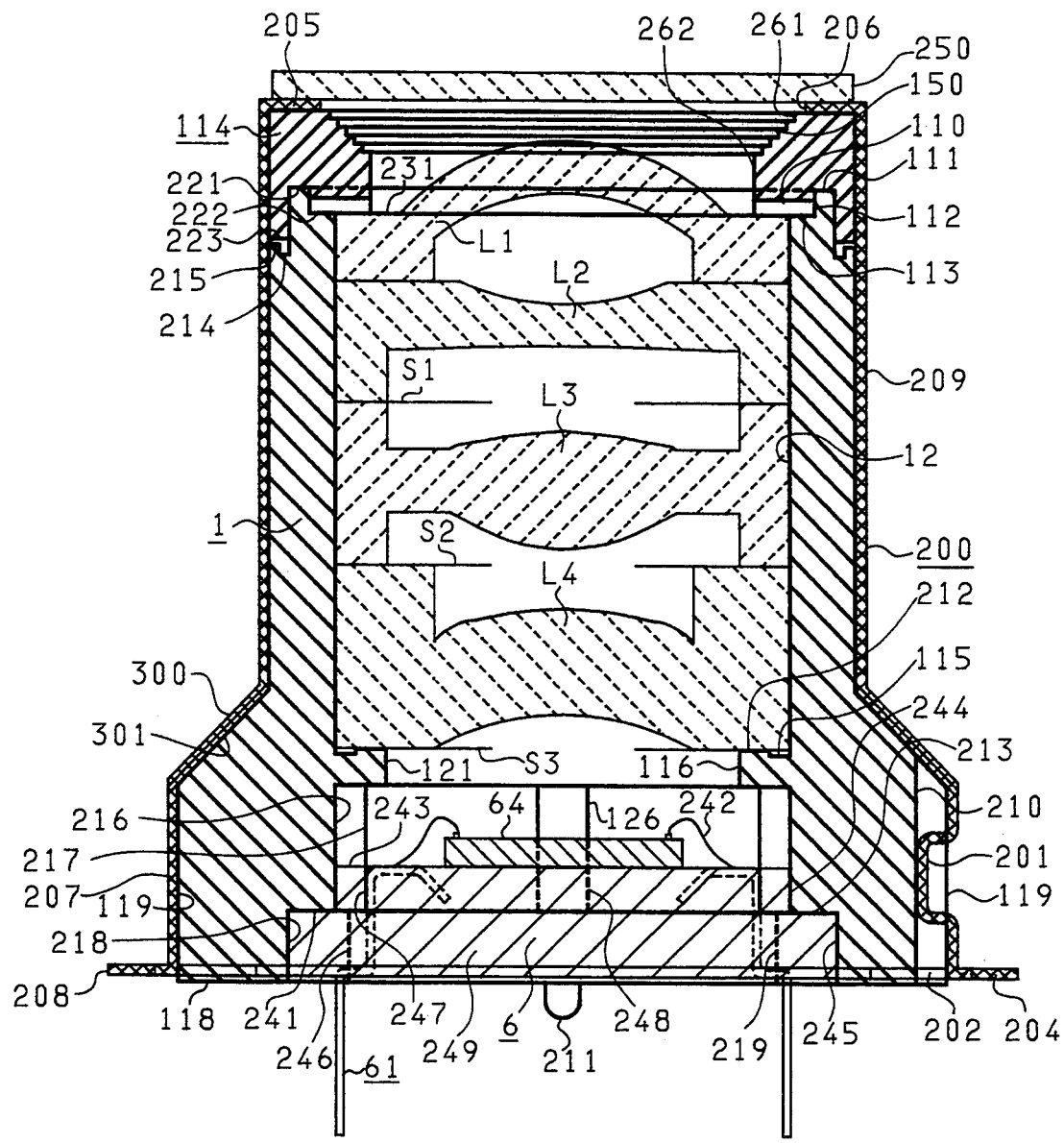
FIG. 17A is a sectional view of the video camera unit in accordance with a further embodiment of the present invention.
Figure 17B:
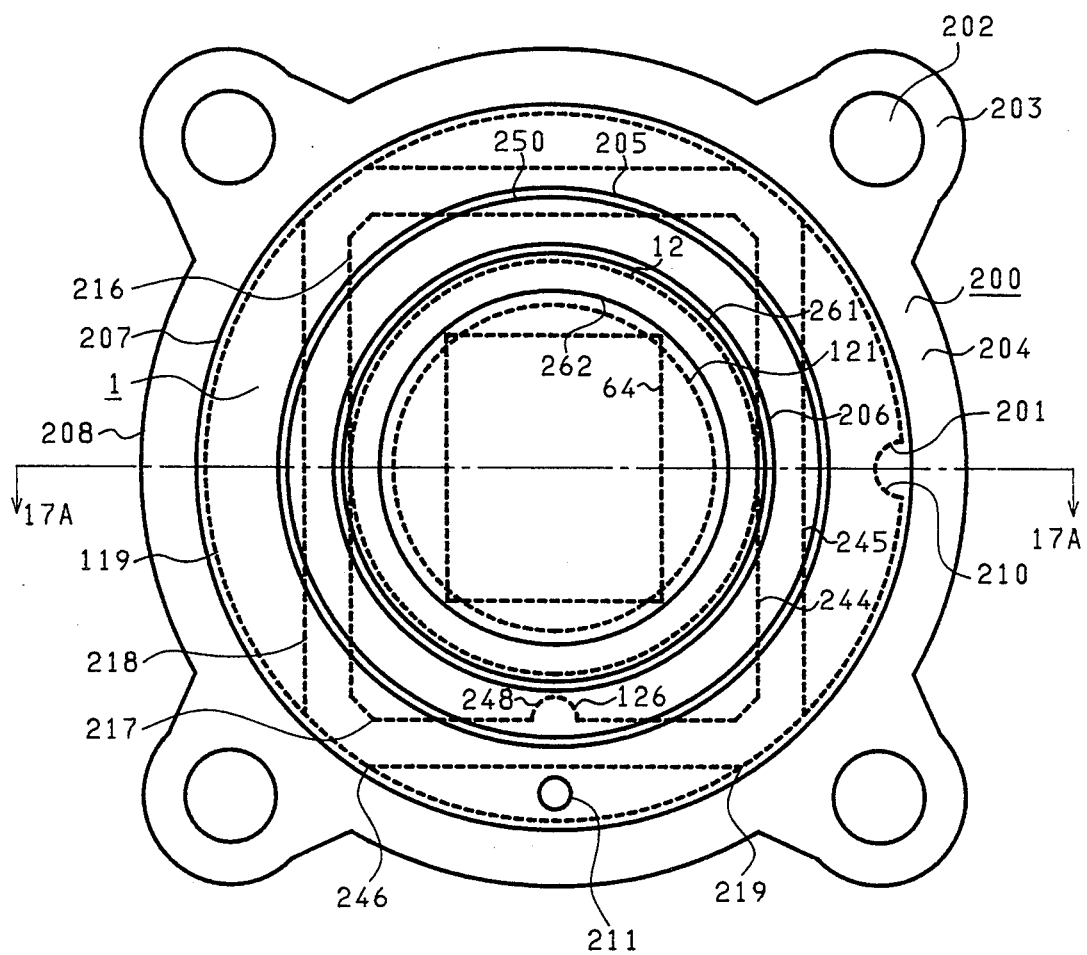
FIG. 17B is a plan view thereof.

FIG. 17A is a sectional view of a video camera unit according to another embodiment of the present invention and FIG. 17B is a plan view of the same when viewed from above. FIG. 17A shows a section taken along the line 17A—17A in FIG. 17B. In order to obviate complexity of the drawing, the plan view of FIG. 17B shows only the main parts with some of the parts corresponding to those in FIG. 17A omitted.

Figure 12A:
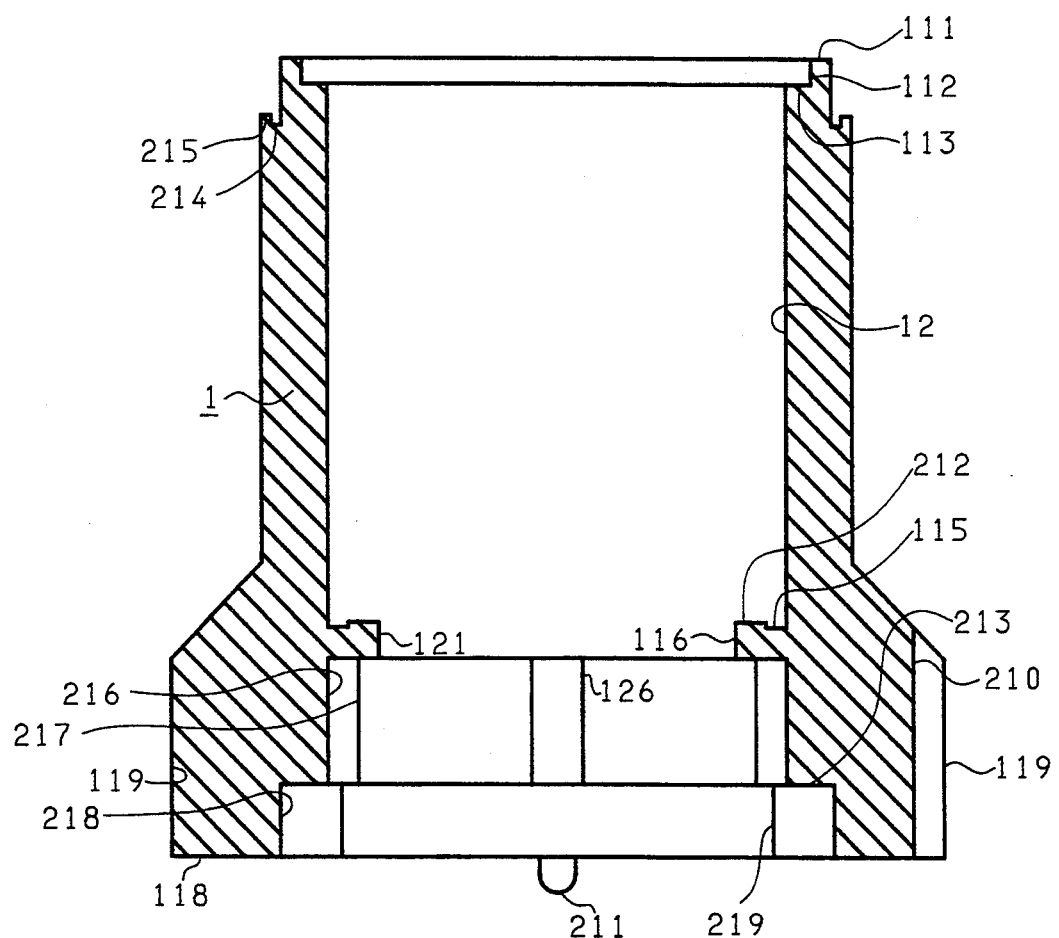
Figure 12B:
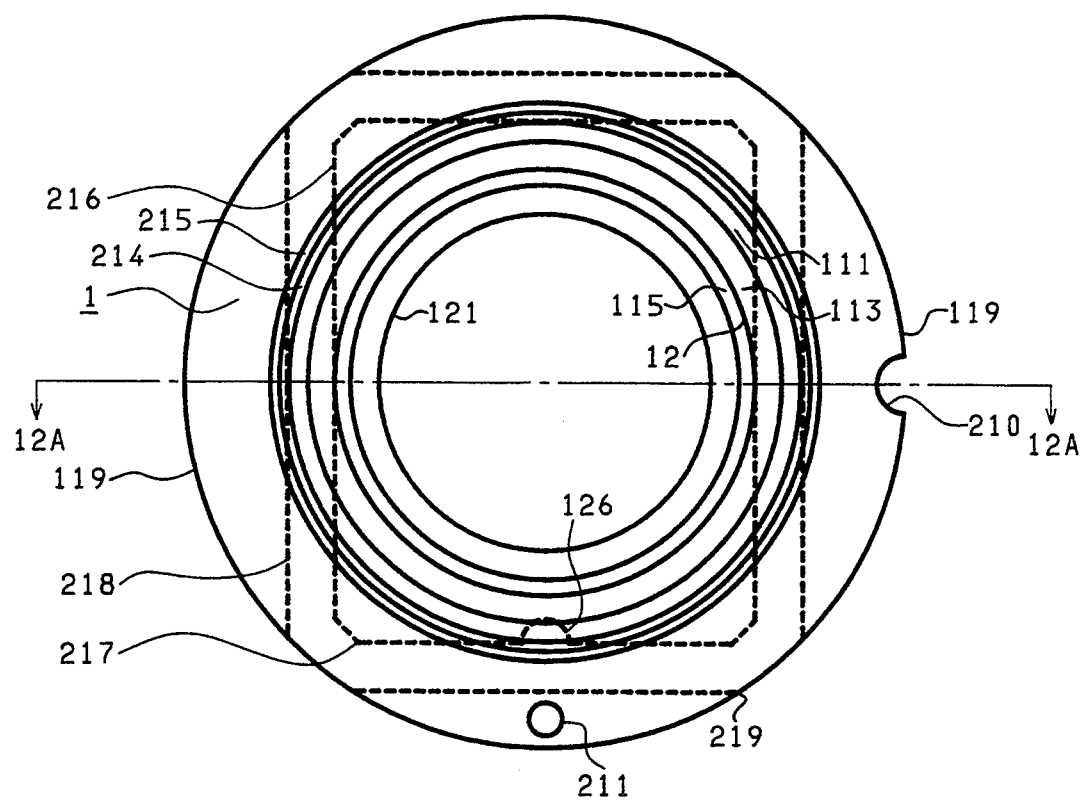
FIG. 12B is a plan view thereof.
Figure 13A:
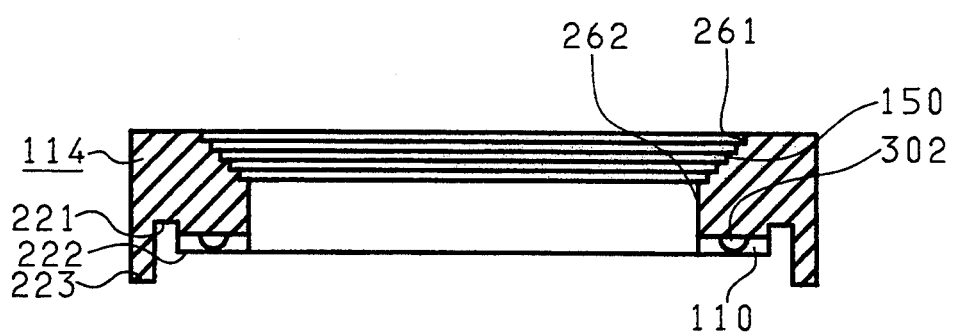
FIG. 13A is a sectional view of a lens holding cover 114.
Figure 13B:
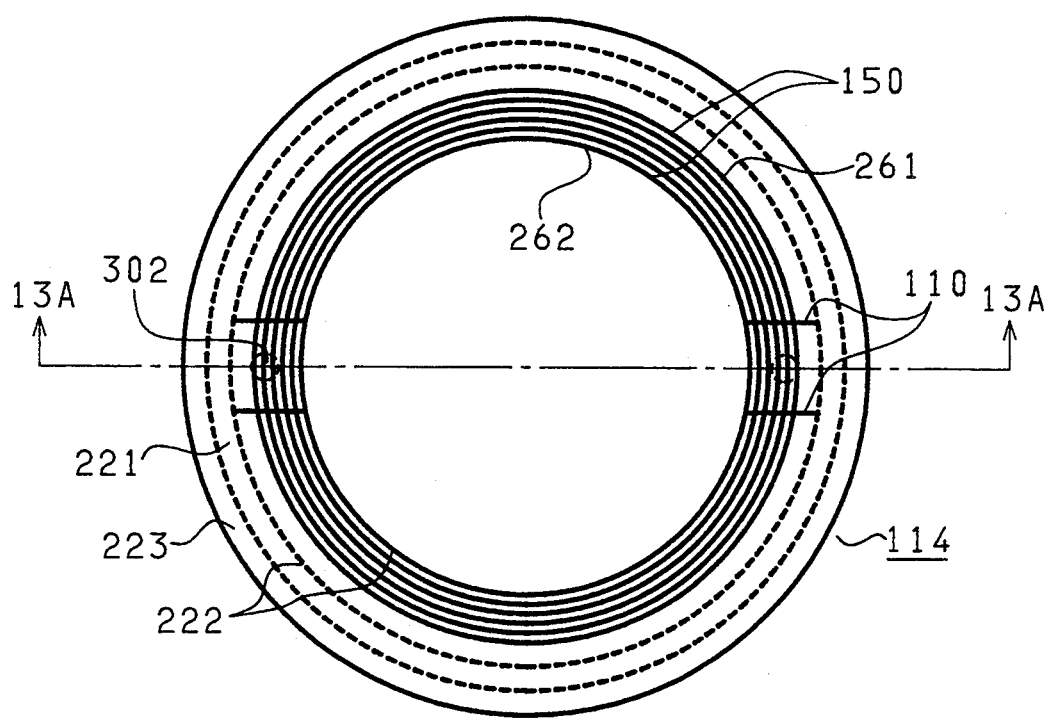
FIG. 13B is a plan view thereof.

The parts in FIGS. 17A and 17B corresponding to those in FIGS. 5 and 6 are designated by the same reference numerals. Among the component parts used in FIGS. 17A and 17B, a shield case 200 is individually shown in FIGS. 15A and 15B, a lens holding cover 114 is individually shown in FIGS. 13A and 13B, the holder 1 is individually shown in FIGS. 12A and 12B, and the solid-state image pickup device 6 is individually shown in FIGS. 14A to 14C. In the following explanation mainly directed to FIGS. 17A and 17B, see developments of these component parts as required.

The holder 1, the lens holding cover 114 and a substrate 249 of the solid-state image pickup device 6 are all made through plastic shaping and are all black in their color to prevent diffused reflection. The cover 114, the holder 1 and the substrate 249 contain glass fiber mixed as filler during the plastic shaping to increase their mechanical strength and to reduce their thermal expansion coefficient. The holder 1 and the cover 114 are made of the plastic material of polycarbonate resin that can be easily shaped (i.e., having high shaping accuracy). The substrate 249, which is required to be heat-resistant because of soldering of leads 61 to a printed board, etc., is made of the plastic material of polyphenylene sulfide.

A shield case 200 serves to prevent the solid-state image pickup device 6 from suffering from electrostatic noise from the exterior, and is made of conducting material such as copper. The shield case 200 is provided, at its bottom, with doughnut shape horizontal portions 204 and leg portions 203 extending horizontally therefrom in four directions. The leg portions 203 serve to fix the shield case to the printed circuit board, etc. This fixing is made through fitting openings 202 provided in the leg portions 203 using screws or bolts. The shield case 200 is connected with a D.C. power source line and A.C. grounded through the bottoms of the leg portions 203 the copper surfaces of which are exposed.

The shield case 200 also serves to mechanically protect the component parts installed therein and increase the moisture-resistant property thereof. On the right side of the drawing, a portion 201 inwardly projecting is adapted to be fitted in a concave portion 210 provided in the holder 1. Using these portions, the shield case 200 and the holder 1 can be positioned in their horizontal rotating direction. In order that the projection 201 does not restrict the movement in the vertical direction when fitting the holder 1 in the shield case 200, the concave portion 210 of the holder 1 is formed to be pieced (or opened) upward.

The shield case 200 is provided at its top with a doughnut shape horizontal portion 205 on which a sheet of flat glass cap 250 is bonded with high airtightness so that a leakage path of water, etc. is not formed therebetween. An inclined portion 301 of the holder 1 and an inclined portion 300 of the case 200 are kept in intimate contact with each other so that water or moisture which might have crept from below at the boundary between the holder 1 and the case 200 is shut out at the inclined portions, thereby enhancing the moisture proof property of the lenses. In order to improve the sealing property, a slight clearance or gap is provided between the doughnut shape horizontal portion 205 of the case 200 and the lens holding cover 114 so that the inclined portion 300 of the case 200 is brought into intimate contact with the inclined portion of the holder 1. Incidentally, the reason why the portions 300 and 301 are inclined is that if they are right-angled as shown in FIG. 2A, it is difficult to increase the contact accuracy.

The total height of the cover 114 and the holder 1 and the height of the shield case 200 are related with each other so that when they are assembled, the bottom of the holder 1 is located at a slightly lower position that the bottom 204 of the shield case 200, i.e., projected therefrom. The thickness of the lower substrate 249 of the solid-state image pickup device 6 (length of line 245) is set to be shorter than the depth of a groove 218 of the holder 1 (length of line 218). In other words, the bottom 118 of the holder 1 is designed to project downwardly from the bottom 204 of the shield case 200 and the bottom of the substrate 249 so that the horizontal accuracy of the attaching to a printed board, etc., depends upon the bottom 118 of the holder 1 independently of the shield case 200 and the solid-state image pickup device 6 which can hardly enhance the horizontal accuracy.

The shield case 200 is formed by pressing a sheet of copper disk ten times or so that its thickness is finally about 0.2 mm. The outer surface of the shield case 200 is painted black to prevent light from being reflected therefrom. A typical technique thereof is a so-called drilube treatment in which baking is made after the painting. In this case, the upper doughnut shape horizontal portion 205 is not painted through a masking technique or the like so that the contact property thereof with the glass cap 250 is not deteriorated. The leg portions 203 and the lower horizontal portion 204 are also not painted through the masking technique or the like so that an electrical contact resistance thereof with the printed board is not increased.

The transparent cap 250, which is made of glass, serves to seal the upper part of the unit and also to cut ultraviolet rays which will deteriorated the plastic lenses L1 to L4. The glass material has also other important features in taking images such as being difficult to scratch and heat-resistant as compared with plastic material.

Concave portions 110 (two for left and right central portions in FIG. 13B) provided in the lens holding cover 114 serve to lower the periphery of projecting portions 302 remaining at the gate portions which are injection openings of resin in shaping the resin so as to prevent the convex portion 302 from projecting the flat portion 222 of the lens holding portion. Thus, the accuracy of holding the lenses is decided by the flat portions 222. The concave portions 110 can be also used as a reservoir of adhesive which overflows when the cover 114 is bonded to the holder 1.

The cap 250 is previously bonded to the shield case 200 for facilitating the assembling. Thereafter, an assembly of the shield case 200 and the cap 250 is assembled with the holder 1 which receives the lenses L1 to L4 therein and which is attached with the cover 114.

An upper flat portion 212 of an inwardly projecting portion 116 of the holder 1 is precisely formed for allowing the lens L4 to be attached with high precision so that its corner which is relatively difficult to work is provided with a concave portion 115 and the accuracy of attaching the lens will be decided by the flat portion 212. A projection 211 provided on the bottom of the holder 1 is an index indicating a direction, which is designed to be inserted into a hole provided in the printed board (it is of course that any hole is not provided on the opposite side). Thus, since the lead pins 61 are symmetrically arranged, it is possible to prevent the video camera unit from being attached to the printed board in the incorrect attaching direction. The attaching direction of the solid-state image pickup device 6 in the vertical direction is decided by the horizontal portion 213 of the holder 1 and a frame flat portion 241 of the solid-state image pickup device 6.

A ring shape groove 214 is formed between the small projection 215 and the large projection 111 in the upper side wall of the holder 1. This groove 214 has a depth and width of about 0.2 mm and has a function of preventing, when the lens holding cover 114 is bonded to the holder 1, excess adhesive from overflowing externally so as to uniformly spread the adhesive along the circumference. This groove 214 may be previously injected with the adhesive. In this case, the adhesive can be spread, through a capillary action, to the periphery of the groove 214 and the boundary between the cover 114 and the holder 1.

The height H1 of the projection 111 of the holder 1 from the top surface thereof to the flat portion 113 and the depth D1 of the groove 221 of the cover 114 from the bottom thereof to the lens holding portion 222 are related to be $D1 \geq H1$. A gap (0.1 mm in this embodiment) is provided between the small projection 215 of the holder 1 and the lowermost surface 223 of the cover 114. Further, the height of the upper inner flat surface of the holder 1 is designed to be equal to or lower than the upper flat surface 231 of the lens L1. These three conditions are required to surely hold the flat surface 231 of the lens L1 with the bottom surface 223 of the cover 114.

Figures 14A, 14B, 14C:
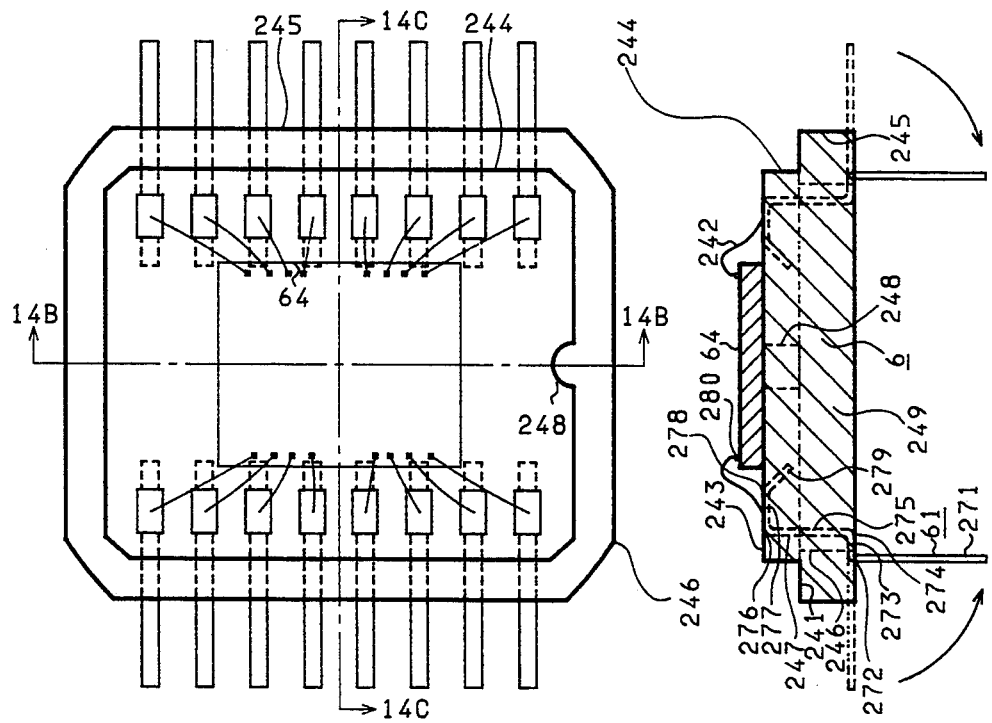
FIG. 14A is a plan view of a solid-state image pickup device 6.
FIGS. 14B and 14C are plan views thereof.
Figure 15A:
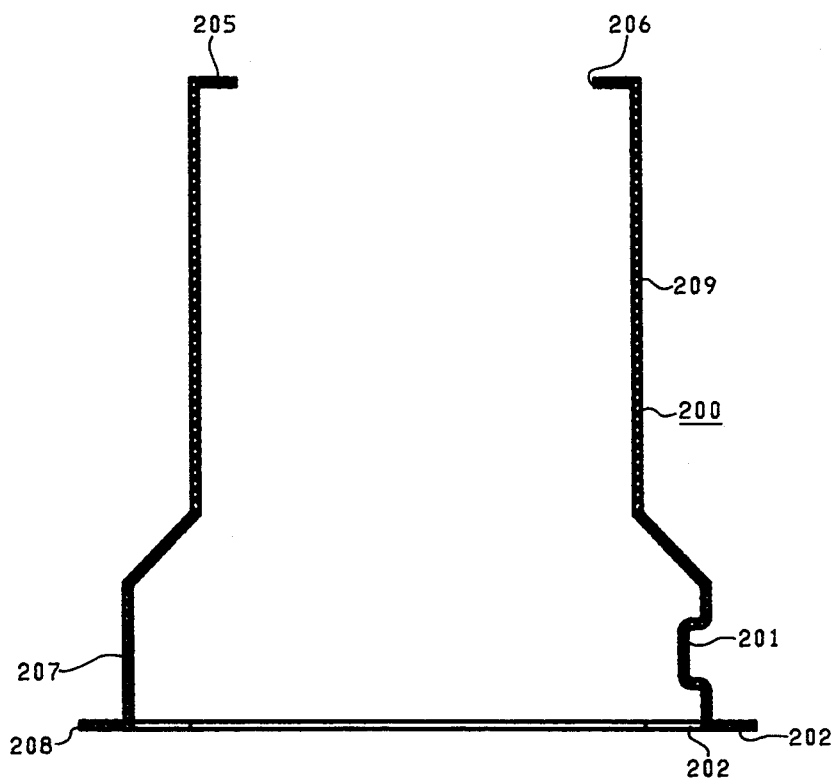
FIGS. 15A is a sectional view of a shield case 200.
Figure 15B:
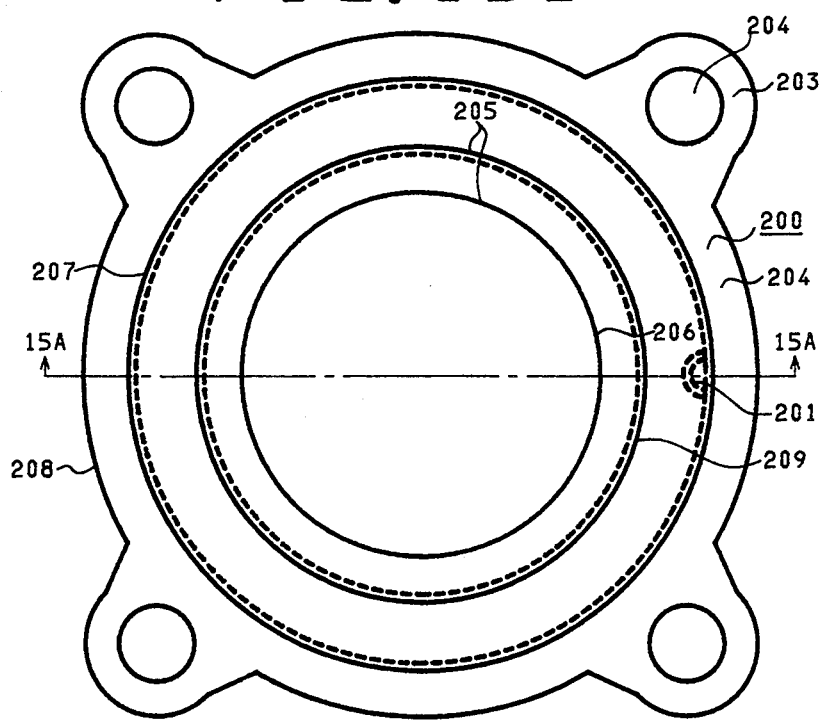
FIG. 15B is a plan view thereof.

Explanation will be given of the solid-state image pickup device 6. For the convenience of explanation, the plan view of FIG. 14A shows the state where the leads 61 are not bent outwardly (towards the printed board); the sectional view of FIG. 14B shows the state where they have been bent; and the sectional view of FIG. 14C shows both states before they are bent (dotted line) and after they have been bent (solid line).

The positions of the holder 1 and the solid-state image pickup device 6 in the rotational direction are decided by the projection 126 of the holder 1 and the concave portion 248 of the device 6. The leads 61 of the device 6 are exposed not along the outside of the side surface 245 of a plastic substrate 249 unlike the embodiment of FIG. 5 but downwardly through the substrate 249 to decrease the gap between the device 6 and the holder 1, thereby improving the moisture-resistance of the unit. An upper tip 279 of the lead 61 is bent downwardly at an angle of about 45° within the plastic substrate 249. This tends to improve the horizontal accuracy of its upper flat portion 277 and firmly fix the lead 61 within the substrate 249. The upper flat portion 277 is exposed to the surface of the substrate 249. An aluminum (A1) wire 280 having a diameter of about 25 μm is bonded to the above flat portion 277 and a bonding pad 280 of a chip 64 by means of the ultrasonic connection technique to electrically connect the flat portion 277 and the chip to each other. The lead 61 is bent by 90° at two lower points 274 and 272. The part from the point 274 to the tip 271 of the lead 61 is extended outwardly in the horizontal direction on the way of assembling. Thereafter, that part is bent downwardly by 90°. If in this case the lead 61 is bent at the point 274, it will be easily broken there. The bending point therefore is the point 272 displaced toward the tip 271 of the lead 61.

Next, a method for manufacturing the solid-state image pickup device 6 will be explained with reference to FIGS. 16A and 16B.

Figure 16A:
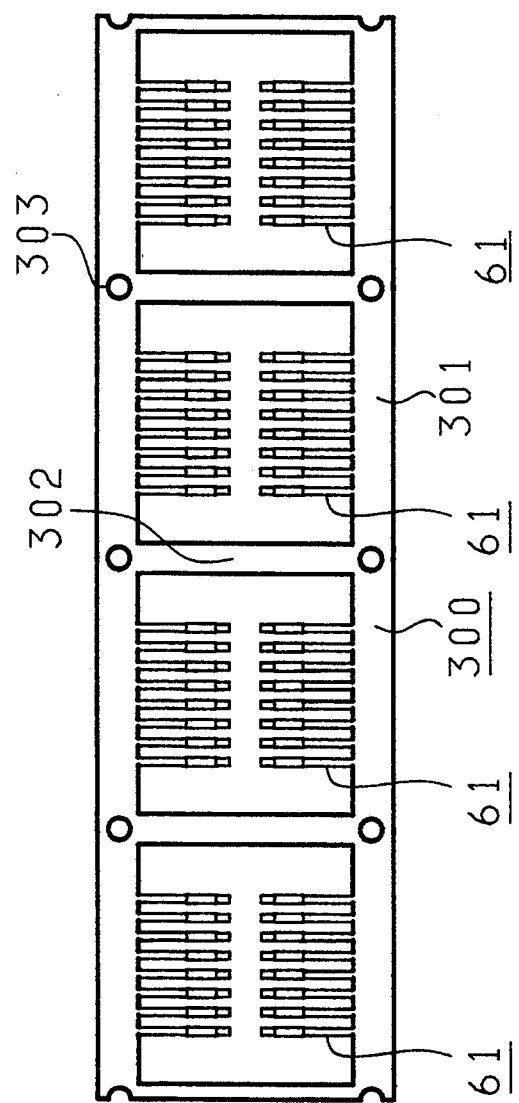
FIG. 16A is a plan view of a lead frame 300 used in assembling the solid-state image pickup device 6.

FIG. 16A is a plan view of a lead frame 300 which is a starting material of the leads 61. In this embodiment, the leads 61 encircled by a vertical frame 302 and a horizontal frame 301 correspond to one device, and the leads 61 corresponding to four devices are successively connected in the horizontal direction. Although an ordinary integrated circuit lead frame has a so-called tab lead for mounting a semiconductor chip, this embodiment is not provided with the tab lead. The lead frame 300 is formed in a pattern as shown in the drawing by stamping a sheet of phosphor bronze by press work. The reason why phosphor bronze is selected is that since it has a high electrical conductivity, a thermal expansion coefficient close to that of resin and a high flexibility it can be easily bent. So-called 42 alloy (Fe-Ni alloy containing 42% iron by weight) may be used instead of phosphor bronze. Each of circular holes 303 shown in the drawing can be used as positioning holes in assembling and holes for transferring the lead frame. Each of bonding posts 277 for bonding the A1 wires 242 is made larger in its width by 0.05 mm for left and right, i.e., a total of 0.1 mm, than the remaining portion thereof so that bonding can be easily performed and also a sufficient distance is left between the respective adjacent leads. The bonding posts 277 is partially plated on its surface with Au to enhance its bonding ability to the A1 wire 242, and the remaining portion is plated with solder to make it easy to be soldered to the printed board, etc.

An assembling process after the lead frame 300 has been formed will be explained below with reference to FIG. 16B. FIG. 16B corresponds to a side view when the plan view of FIG. 16A is taken in the vertical direction.

In step (a), the lead frame 300 has been pressed and partially plated with Au and solder. As a material for the solder plating, a material containing tin (Sn) in a considerably low ratio to lead (Pb) is selected so as to have a higher melting point than the temperature of plastic molding to be described in step (c).

In step (b), the lead 61 is bent at three bending points 278, 276 and 274.

In step (c), the lead frame 300 is plastic-molded.

In step (d), the lead 61 is bent at a bending point 272.

In step (e), the solid-state image pickup chip (die) 64 is bonded to the central portion of the upper surface of the plastic substrate 249 by jetting instantaneous hardening type viscous epoxy resin from multiple nozzles of an applier (die bonding). Then, the chip 64 is positioned referring to the circular holes 303 of the lead frame. This die bonding is carried out at room temperature, and thereafter, curing is performed at a temperature of about 160° C. to harden the epoxy resin. Thereafter, the A1 wire 242 is ultrasonic-bonded to the bonding post 277 and the pad 280 of the chip 64.

In step (f), unnecessary portions (e.g., frame 301) of the lead frame 300 are then cut off after an assembly consisting of the holder 1, the lenses L1 to L4 and the cover 114 is bonded onto the substrate 249 and the shield case 200 is further bonded thereon. In this alternative, a series of assembling steps can be easily automated on the lead frames 300 having many leads successively arranged.

The assembling process mentioned above and the lead frame 300 are different from the case of the ordinary integrated circuit in the following points.

(1) The plastic molding is carried for only the lead frame, and it is not carried out after the die bonding of the chip and the wire bonding have been completed.

(2) The molded plastic is used as a substrate for mounting the chip thereon but is not used to seal the chip.

(3) The bonding post 277 of the plastic-molded lead 61 is exposed to the surface but is not embedded in the plastic.

(4) After the plastic molding, the chip 64 is substantially sealed by the holder 1 and the shield case 200.

(5) The bonding step of the leads has been completed before the die bonding so that any stress is not applied to the chip during the bending step.

(6) Since those portions of the leads 61 which extend from their bonding posts 277 to their tips 271 are arranged substantially in parallel with each other with a constant pitch, the shape of the leads 61 can be made simple.

Embodiment 6

Figure 18B:
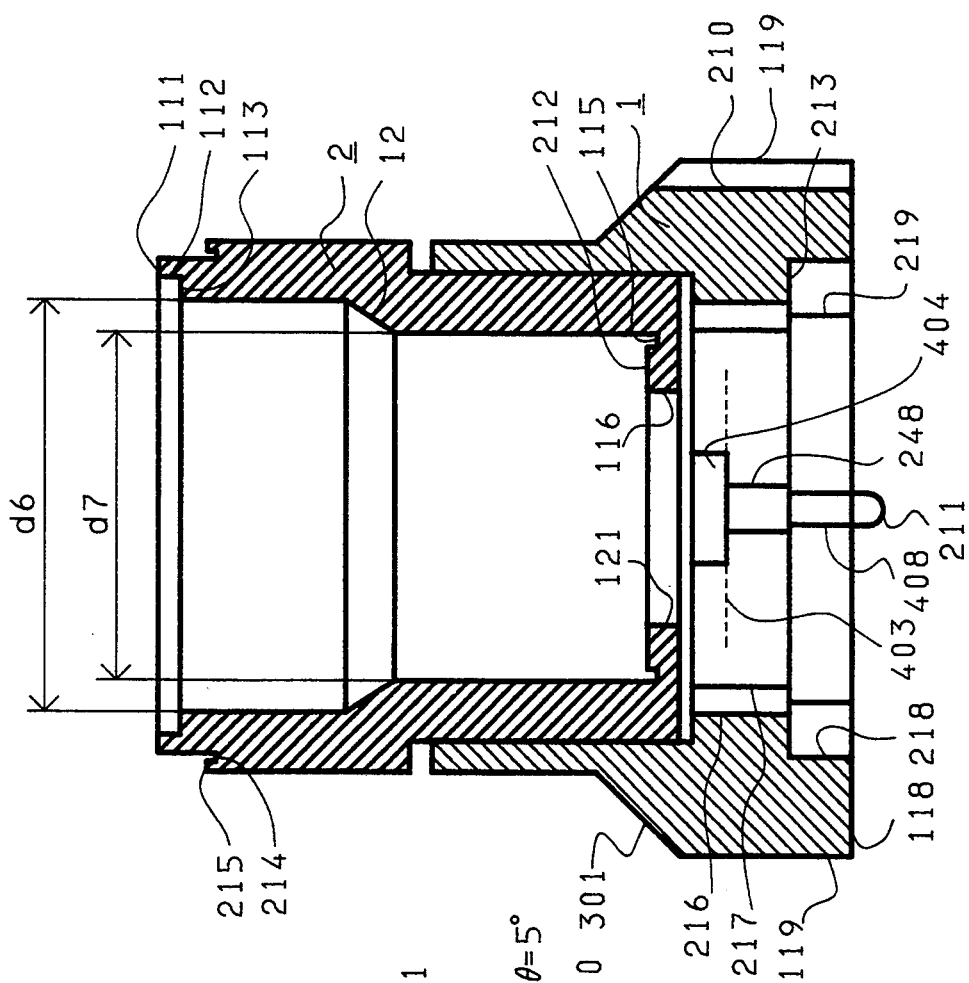
FIG. 18B is a sectional view thereof.
Figure 18A:
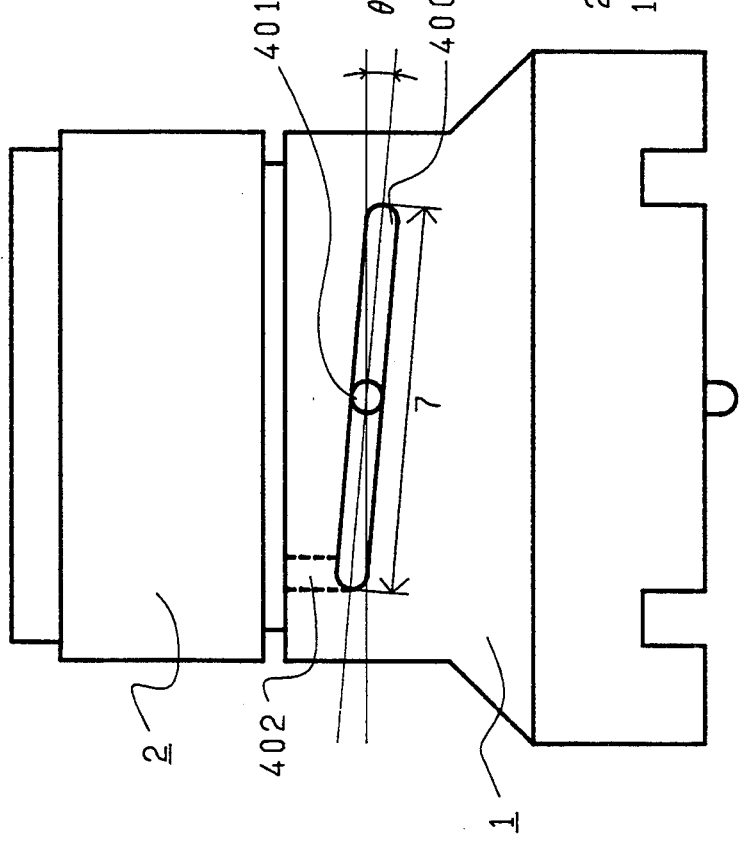
FIG. 18A is a side view of a holder portion.
Figure 28A:
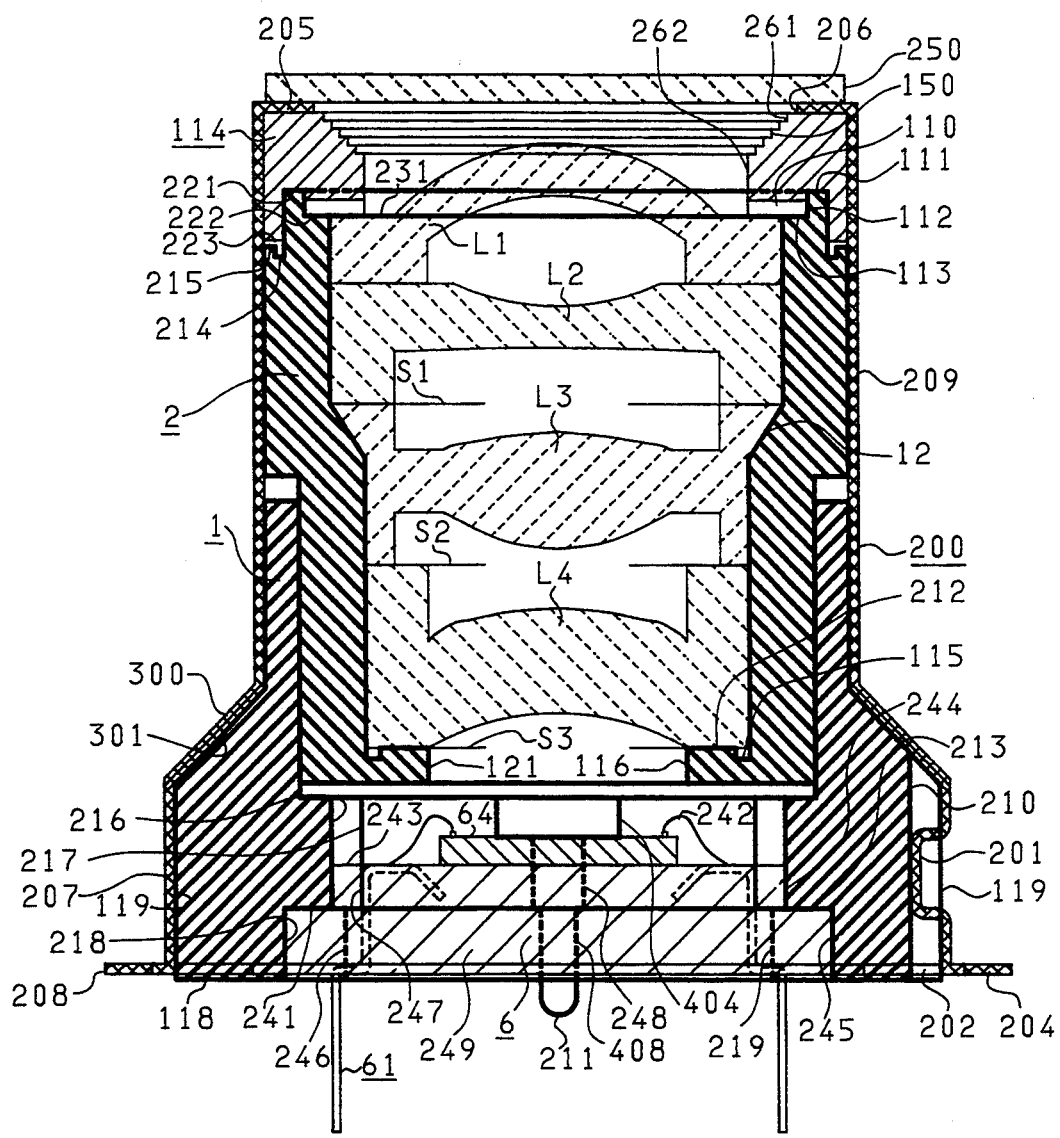
FIG. 28A is a sectional view of the video camera unit in accordance with a further embodiment of the present invention.
Figure 28B:
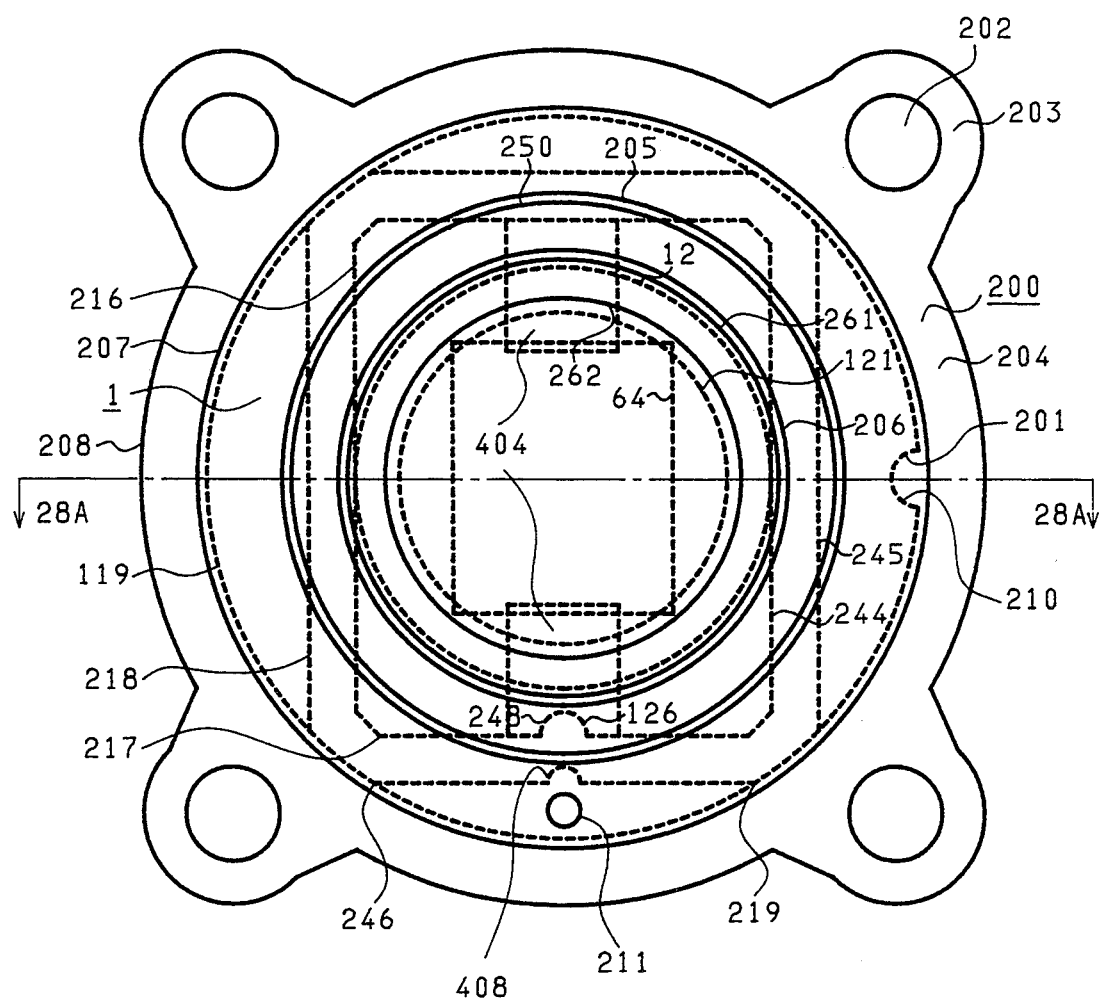
FIG. 28B is a plan view thereof.

Description will be given below of an embodiment in which the holder has a function of adjusting the back focus of the lens. FIG. 28A is a sectional view of a video camera unit according to still another embodiment of the present invention and FIG. 28B is a plan view of the same when viewed from above. FIG. 28A shows a section taken along the line 28A—28A in FIG. 28B. In order to obviate complexity of the drawing, the plan view of FIG. 28B shows only the main parts with some of the parts corresponding to those in FIG. 28A omitted. FIG. 18A is a side view showing holders 1 and 2 alone which are assembled and FIG. 18B is a sectional view of the same. FIGS. 19A, 19B and 19C are respectively a bottom view, a sectional view and a top view of the holder 1. Likewise, FIGS. 20 illustrate the holder 2 individually.

Differently from the above embodiment, the holder is separated into two, i.e., the holder 1 and the holder 2 in this embodiment. Four lenses L1 to L4 are received in the holder 1 and a solid-state image pickup device 6 on which a solid-state image pickup chip 64 is mounted is received in the holder 2.

Both holders are fixed to each other while overlapping each other such that the inner wall portion of the holder 1 partially covers the outer peripheral surface of the holder 2. This intends to improve the accuracy of deviation between the cylinder axes of both holders as well as to improve the strength of the cylindrical holders.

A groove 400 (or slit) is formed in the holder 1 obliquely at an angle of $\theta=5°$ with respect to a section which is perpendicular to the cylinder axis of the holder. Although not necessarily limitative, the groove 400 is a through groove.

On the other hand, the holder 2 is provided with a projection 401 (or pin) which is inserted into the groove 400 of the holder 1.

Rotary motion of the projection 401 along the groove 400 makes it possible to adjust the distance between both holders in the direction of the cylinder axis (namely, it is possible to adjust the distance between the respective lenses L1 to L4 and the solid-state image pickup chip 64). This adjustment enables the back focus of the lens to be adjusted within the range of $7 mm \times \sin 5° = 0.61$ mm.

Figures 20A, 20B, 20C:
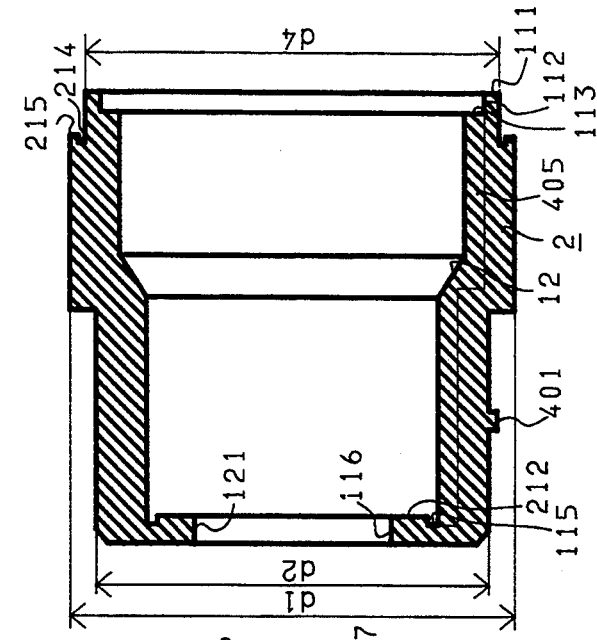
FIG. 20A is a bottom view of a holder 2.
FIG. 20B is a sectional view thereof.
FIG. 20C is a top view thereof.

The holder 2 is designed to satisfy the condition of d1>d2 as shown in FIG. 20B. It is noted that d2 represents the outside diameter (or inside diameter) of the portion of the holder 2 which overlaps the holder 1 and d1 represents the outside diameter (or inside diameter) of the portion of the holder 2 which is located on the opposite side to the holder 1 with respect to the overlapping portion. This tends to prevent expansion of the outside diameter d3 of the portion of the holder 1 which overlaps the holder 2 (see FIG. 19B). Further, assuming that d4 represents the outside diameter of the portion of the holder 2 which overlaps the lens holding cover 114 and d5 represents the outside diameter of the portion of the holder 1 located on the device receiving side, these outside diameters are set to satisfy the conditions of d4<d1<d5 and d4<d3<d5. Although not necessarily limitative, it is convenient to make the outside diameters d1 and d3 substantially equal to each other so as to equalize the outside diameters of the both holders so that the holder can be easily received in the peep hole of the monitor camera when it is used therein because only one hole diameter must be taken into account.

Diameters of the lenses received in the holder 2 are set in agreement with the inside diameter of the holder 2. Assuming that the diameter of the lens L4 received on the device side is d7 and the diameter of the lens L1 on the opposite side to the device with respect to the lens L4 is d6, these lens diameters are set to satisfy the condition of d6>d7. This intends to assure a large effective area of the first lens to construct a wide angle lens.

A concave portion 405 is formed in the inner wall of the holder 2 as shown in FIGS. 20B and 20C for receiving the vestige of the gate used in injecting plastic material in forming the lenses. This eliminates the need of trimming of the vestige of the lens gate and, in other words, it is even admitted that perfect trimming cannot be performed. Likewise, there are remained on the bottom of the holder 2 vestiges 406 of the gate portions used in injecting the resin, and however, concave portions (407) are provided around these respective gate portion vestiges 406 so as to prevent the gate vestiges 406 from projecting to become obstacles, resulting in elimination of the need of trimming of the gate portion vestiges 406.

Next, the structure of the holder 1 will be described. The holder 1 is provided with the groove 400 as described before (see FIG. 18A). An insertion groove 402 through which the projection 401 is inserted into the groove 400 is formed at the left end of the groove 400. The insertion groove 402 may be formed at the right end of the groove 400. The insertion groove 402 is designed to have a depth smaller than the cylinder thickness of the holder 1 as shown in FIG. 19C (so as to be prevented from piercing through the holder cylinder), thereby improving the strength of the cylinder.

A reference surface 403 is provided inside the holder 1. A surface of the solid-state image pickup chip 64 serving as the light receiving surface is pushed against stoppers 404 so as to be brought into mechanical contact with the reference surface 403. The stoppers 404 serve to position the focal plane on the top surface of the chip 64 and to decrease the inclination error of the chip surface in pelleting and sealing.

In case that the chip 64 is pushed against ;the stoppers 404 to fix by bonding the image pickup device 6 to the holder 1, one or both of the pelleting material and the sealing material may be an elastic material such as the bonding agent of silicon rubber in order to reduce the stress applied to the chip 64.

Figure 21:
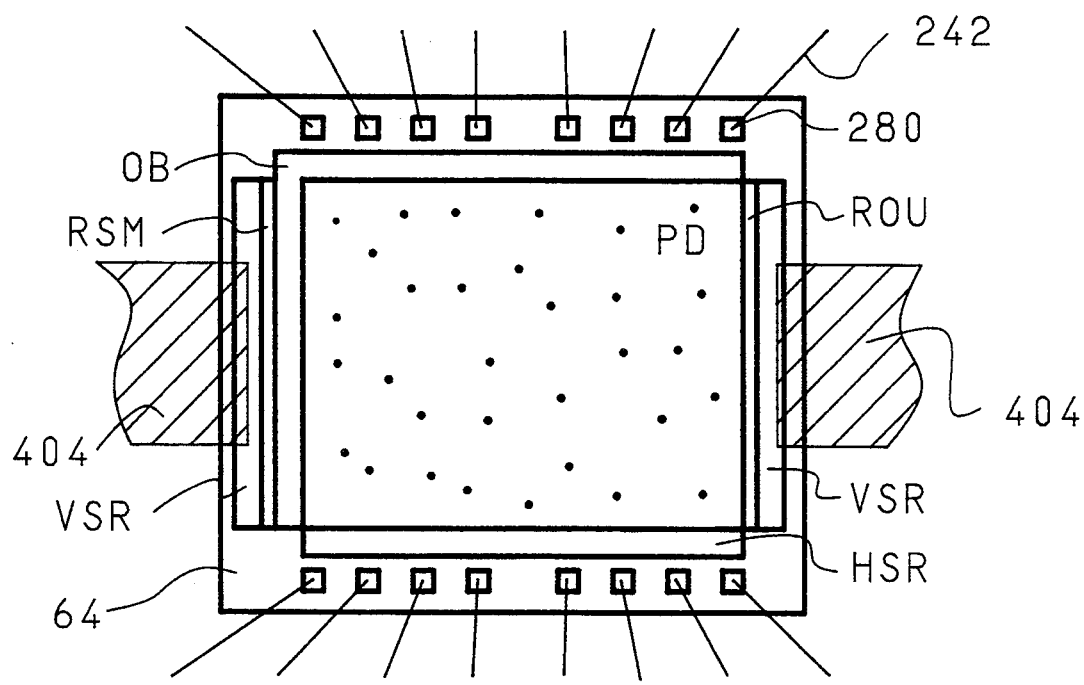

FIG. 21 shows the layout of the chip 64 is relation to the stopper 404. The solid-state image pickup chip 64 has bonding pads 280 arranged along one of pairs of (upper and lower) opposite sides of the chip, while the other pair of (left and right) opposite sides of the chip are fixed at their certain portions to the stoppers 404. It is noted that these certain portions are located outside the light receiving area of the chip 64 in which a plurality of photoelectric transfer elements are arranged. This chip layout is intends to assure a large light receiving area in the direction of the left and right opposite sides as well as to eliminate the fear of flawing the bonding pad 280 and cutting off the A1 wire 242.

Next, description will be given of the system for automatically controlling the back focus of the lens. In the video camera unit in which the holder 2 incorporating the lenses and the holder 1 incorporating the image pickup device 6 are assembled, the back focus at the reference surface 403 is detected. The back focus is detected in the following manner. A striped black and white pattern is set at a certain imaging distance, for example, and is shot by means of the video camera unit. Then, electrical signals thus obtained are processed by the high-pass filter so as to taken out the high frequency component of the signal. Since the high frequency component is maximized in just focus, that is, at the time when the back focus reaches the certain value, the electrical signal at this time is input to the holder drive system which serves to adjust the distance between the holders 1 and 2, thus determining the point at which the high frequency component of the signal is maximized. Subsequently, ultraviolet-setting resin is poured by an amount enough to satisfactorily fix the groove 400 of the holder 1 and the projection 401 of the holder 2 to each other, and a predetermined quantity of ultraviolet rays is applied to thereby assure bonding and fixing in an instant. Further, hot melt bonding agent may be used as other fixing method.

The following methods are known as the video camera unit assembling method.

(1) Mounting device after assembling both holder and adjusting back focus

①　The holder 2 in which the lenses are received is assembled with the holder 1.

②　After the back focus at the reference surface 403 is adjusted, the both holders are fixed to each other.

(3) The solid-state image pickup device 6 is mounted without being adjusted, thus completing the assembling.

According to this method, the assembling and adjustment of the lens and holder can be carried out separately from the manufacture and mounting of the device. It is therefore possible to divide the allotment of manufacture into the optical field and the semiconductor field, for example. This contributes to mass-productivity.

(2) Adjusting back focus after mounting device (1) The lenses are received in the holder 2 and the device 6 is received in the holder 1. Then the both holders are assembled together.

(2) The back focus is adjusted at the reference surface 403 constituted by the top surface of the chip of the device and, then, the both holders are fixed to each other.

According to this method, since the back focus is adjusted at the later state of the assembling (that is, at the stage where various factors of fluctuation are included), it can be adjusted very accurately.

Embodiment 7

Figure 1A:
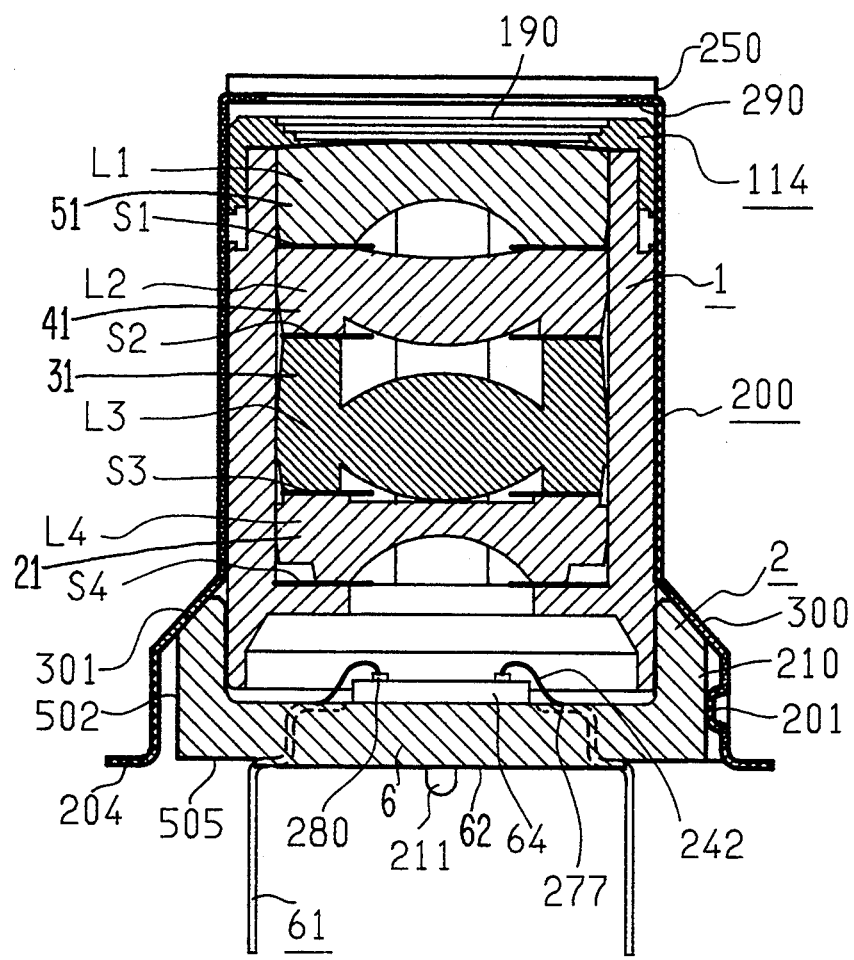
FIG. 1A is a sectional view of a video camera unit in accordance with one embodiment of the present invention.
Figure 1B:
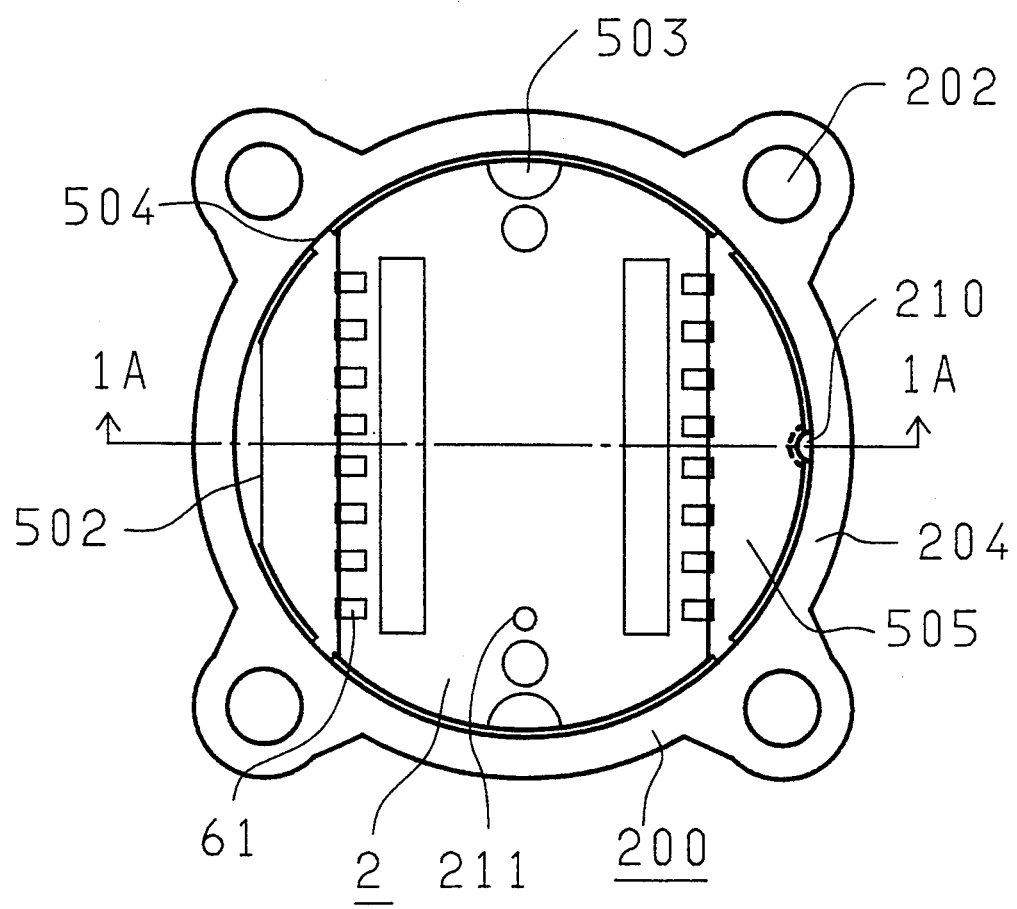
FIG. 1B is a bottom view thereof.
Figure 22A:
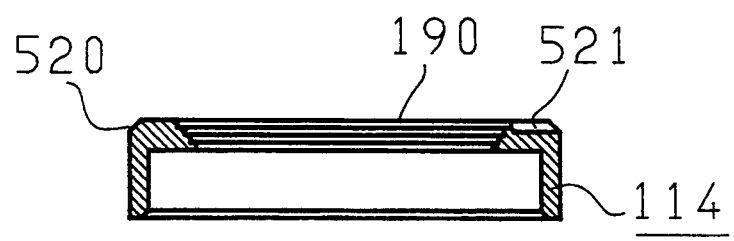
FIG. 22A is a sectional view of a lens holding cover.
Figure 22B:
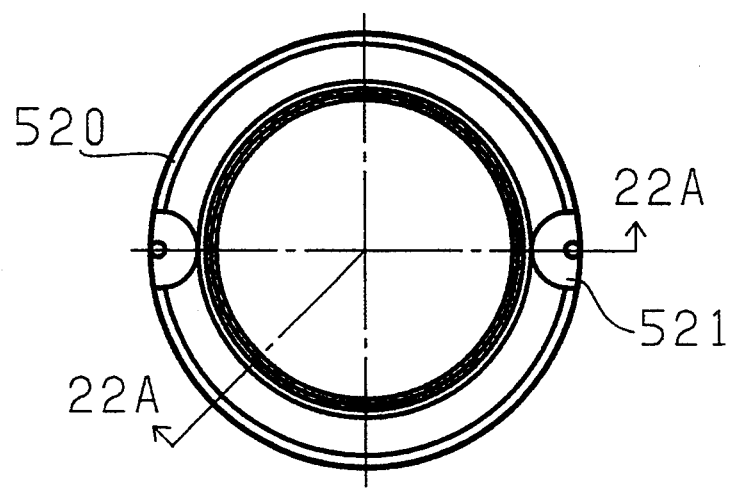
FIG. 22B is a plan view thereof.
Figure 23A:
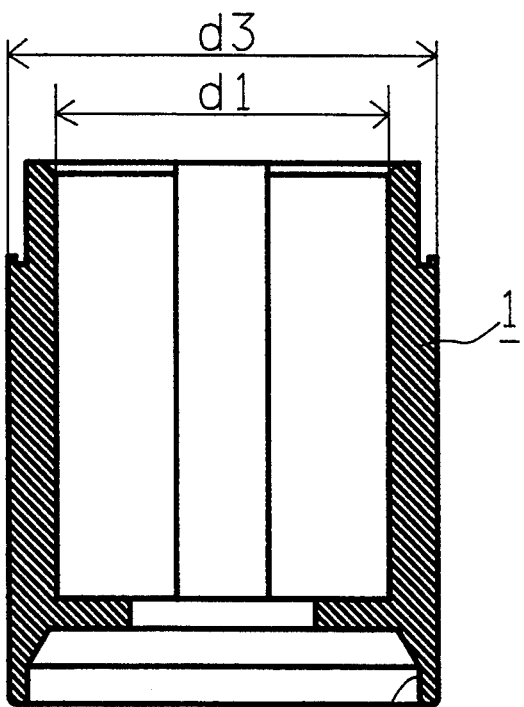
FIG. 23A is a sectional view of a holder.
Figure 23B:
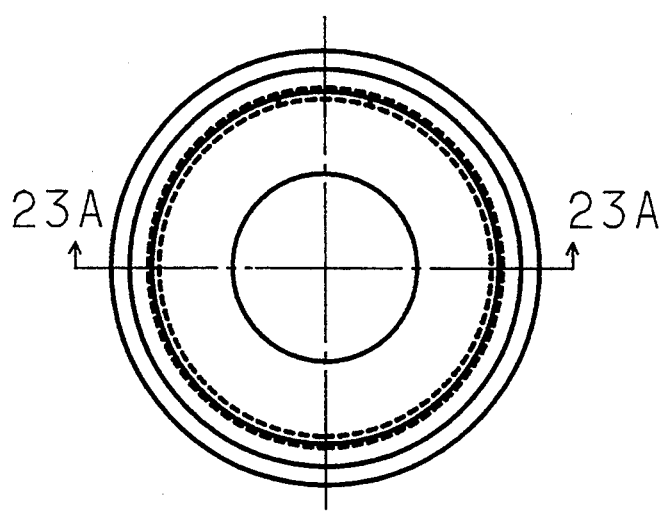
FIG. 23B is a bottom view thereof.
Figure 24A:
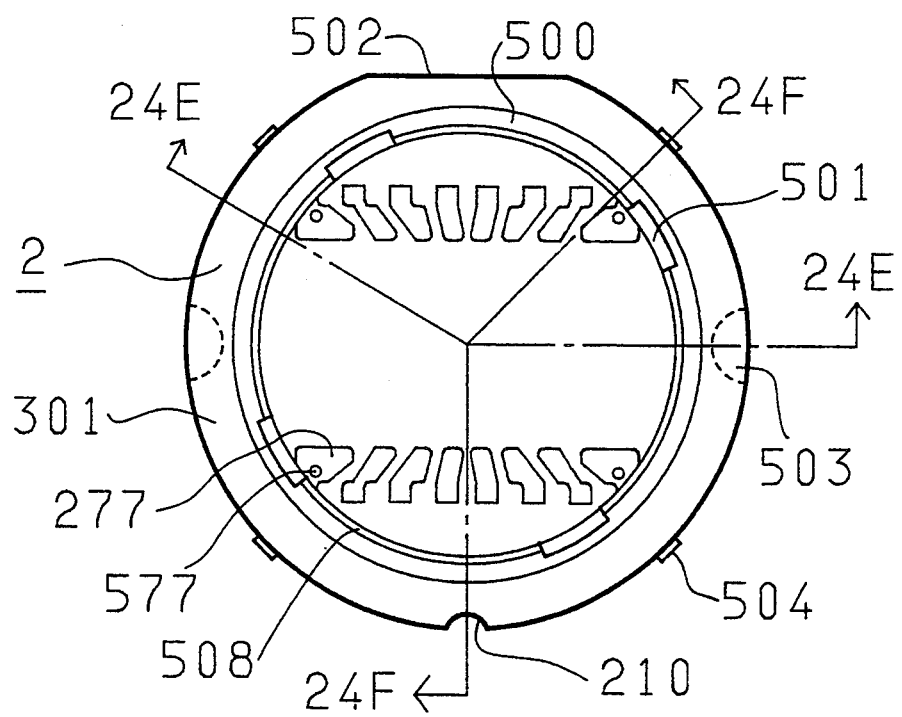
FIG. 24A is a top view of a base.
Figure 24B:
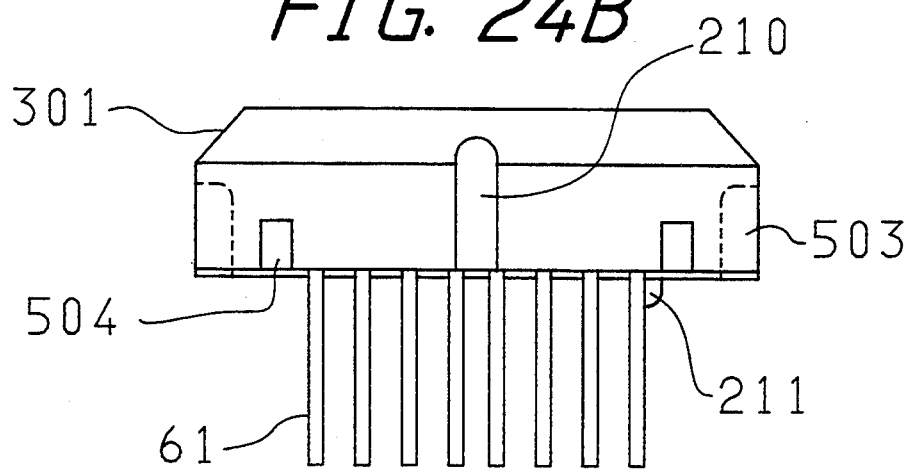
FIGS. 24B and 24C are side views thereof.
Figure 24C:
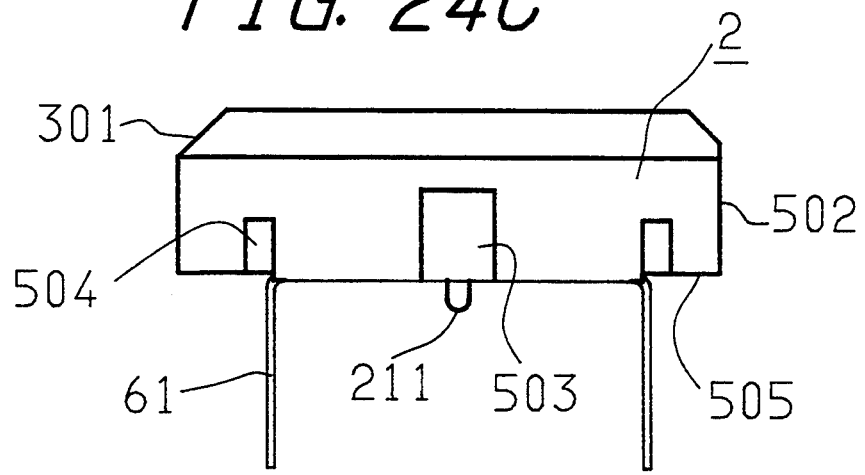

Description will be given of a further embodiment of the video camera unit which comprises a base on which the solid-state image pickup chip is mounted and a holder for receiving the lenses and which has a function of adjusting the back focus of the lens. FIG. 1A is a sectional view of the video camera unit according to the embodiment of the present invention and FIG. 1B is a bottom view of the same when viewed from below. FIG. 1A shows a section taken along the line 1A—1A in FIG 1B. FIGS. 22A and 22B are respectively a sectional view and a top view of a lens holding cover. FIGS. 23A and 23B are respectively a sectional view and a bottom view of the holder. FIGS. 24A, 24D, and 24B and 24C are respectively a top view, a bottom view and opposite side views of the base. FIGS. 24E and 24F show sections taken along the lines 24E—24E and 24F—24F in FIG. 24A, respectively.

The main body is separated into two, i.e., a holder 1 and a base 2. Four lenses L1 to L4 are received in the holder 1 and a solid-state image pickup chip 64 is mounted on the base 2. The base 2 of this embodiment has such a structure that the substrate 249 on which the solid-state image pickup chip 64 is mounted and the holder 1 of the embodiment 6 are united into one body. The holder 1 and the base 2 are fixed to each other while overlapping each other such that the inner wall portion of the base 2 partially covers the outer peripheral surface of the holder 1. This intends to improve the accuracy of deviation between the cylinder axes of the holder 1 and the base 2 as well as to improve the strength of the unit.

The holder 1 has a cylindrical shape of an inside diameter d1. Alternatively, the holder 1 may be of the double inside diameter type that receives the front lens of large inside diameter and the rear lens of small inside diameter. The sections of the holder 1 and the base 2 taken at their sliding portions perpendicularly to the cylinder axis have the circular shapes having respectively an outside diameter d3 shown in FIG. 23A and an inside diameter d4 shown in FIG. 24F. The outside diameter d3 and the inside diameter d4 are made substantially equal to each other so that the holder 1 is fitted in the base 2 so tightly as not to move spontaneously by its own weight or the like (not to slide without application of force). The sliding motion of the holder 1 and the base 2 in the cylinder axis direction enables the back focus of the lens to be adjusted. In case that the focal length of the lens is measured in advance, a knockdown assembling may be carried out with a spacer matching for the focal length interposed between the holder 1 and the base 2. After adjustment of the focal length, the holder 1 and the base 2 are fixed to each other with bonding agent.

Figure 24D:
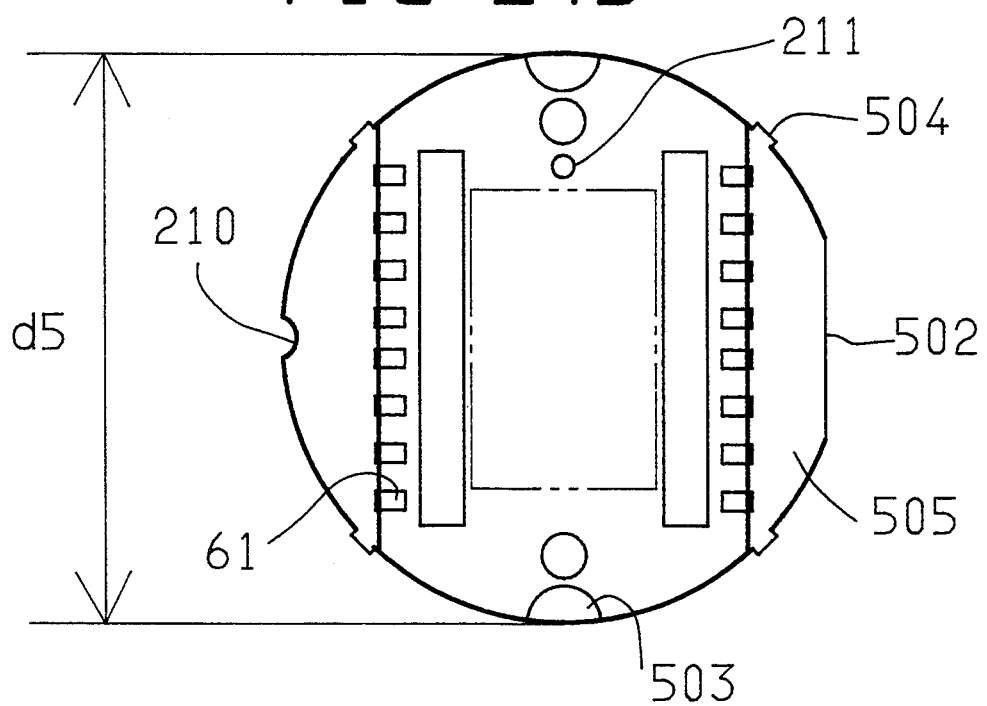
FIG. 24D is a bottom view thereof.
Figure 24E:
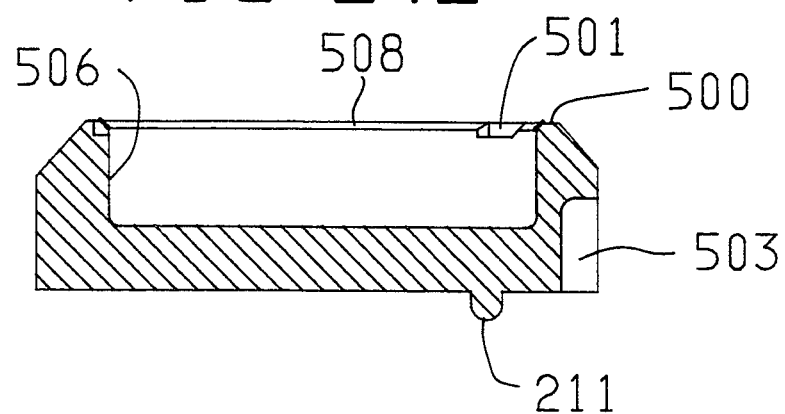
FIGS. 24E and 24F are sectional views thereof.
Figure 24F:
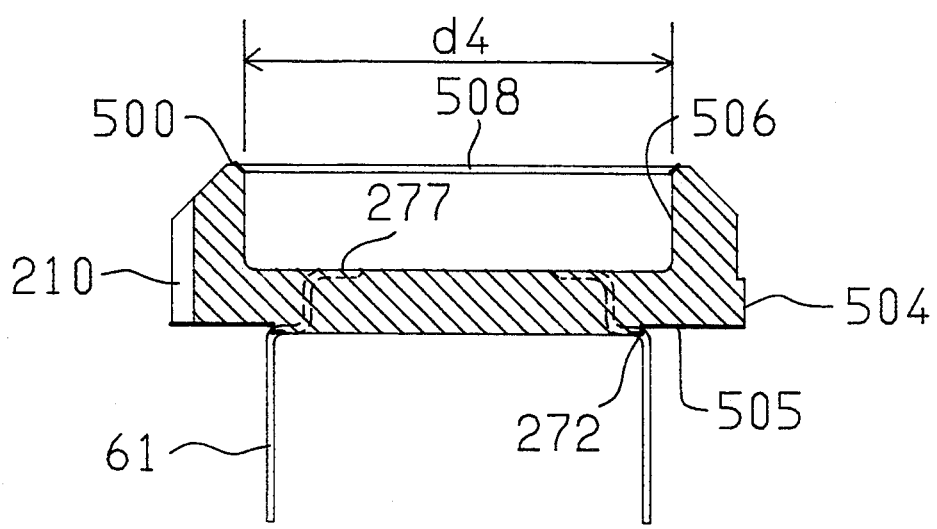

The base 2 has a cylindrical shape of an outside diameter d5 as shown in FIG. 24D. The outside diameter of the base 2 is made larger than that of the holder 1 as $d5 > d3$. The base 2 is provided with a tapered portion 301 which serves as stopper means together with a tapered portion 300 of the sleeve 200 so that, when the sleeve 200 is attached onto the base 2 and the holder 1 which are fixed to each other, an end portion 290 of the sleeve 200 is prevented from coming in contact with an upper end portion 190 of the lens holding cover 114 of the holder 1 in which the adjusted movable lens is received. A top surface 500 and a portion 508 contiguous to the inner wall of the tapered portion 301 of the base 2 are chamfered and formed with concave grooves 501 for the purpose of application of the bonding agent. It is therefore possible to instantaneously fix by bonding the holder 1 and the base 2 to each other after adjustment of the back focus of the lens. Owing to this structure, the sealing property attained inside the holder 1 when the sleeve 200 is attached to assure the airtight sealing can be prevented from being deteriorated due to swelling of the bonding agent when the holder 1 and the base 2 are bonded to be fixed to each other.

In order to improve the accuracy of positioning the base 2 at the time of die-bonding the chip 64, the base 2 is formed with a chamfered portion 502 for restricting the position in the rotating direction so that the base 2 can be fixed with this chamfered portion pushed against the flat surface. In addition, a groove 210 and a projection 211 are provided as index marks. The index groove 210 is used in positioning in the horizontal rotating direction, into which a portion 201 projecting inwardly from the sleeve 200 is inserted. The index pin 211 can be used not only as index for determination of the pin number of the leads 61 but also as projection for preventing inverse sticking into the printed board. Further, grooves 503 for carrying jigs are also provided in consideration of the improvement of the mass-production facilities.

Bonding posts 277 of the base 2 are arranged to be directed inwardly toward the center of the chip 64 as shown in FIG. 24A, and wire bonding points on the respective bonding posts 277 are located inside the inner peripheral surface 507 of the holder 1. This intends to prevent the wire 242 bonded to the bonding post 277 close to the circumference of the holder 1 from being cut off when the holder 1 is inserted into the base 2 as well as to shorten the length of the wire 242 itself. The bonding posts 277 at the four corners are formed respectively with holes 577 for pattern recognition which serve as reference point for determination of other coordinates in wire bonding. The region 505 of the bottom of the base 2 outward of the bending point 272 of each lead 61 is stepped to be lowered by an amount corresponding to the thickness of the lead 61, so that there exists no plastic mold between the adjacent leads 61. This intends to facilitate the bending of the lead 61 at the bending point 272, while contributing to prevention of cracking and exfoliation of the plastic at the time of removing the molds.

After fixing the holder 1 and the base 2 to each other, the sleeve 200 is attached onto them so as to seal the inside of the holder 1 airtightly. Airtight sealing is attained by sealingly bonding the abutting surfaces of the tapered portion 301 of the base 2 to the tapered portion 300 of the sleeve 200. Differently from the embodiment 6, sealing is performed once only in sealingly assembling the base 2 and the sleeve 200 in this embodiment, thereby reducing the defective potential owing to decrease of the sealing portion in the assembly. Bonding of the base 2 and the sleeve 200 requires application of the external force. For this reason, the base 2 is provided with projections 504 at four portions on the side surface thereof so as to be press-fitted in the sleeve 200, thereby assuring pressure-fitting and fixing. There is another method, as shown in FIG. 25C, that the flange portion 204 of the sleeve 200 is partially notched to form straight caulking pawls 510 which are bent in the state that the base 2 and the sleeve 200 are assembled together, thereby holding them without application of any external force until the bonding agent is hardened. In addition, the sleeve 200 may be provided with projections on the inner peripheral wall thereof so as to assure fixing by press-fitting the base 2 therein. Besides, the sleeve 200 is formed in its flange portion 204 with tapped holes 202 for mounting to the main body. One of the tapped holes 202 which has a diameter different from that of the others can be used as a mark for determination of the direction of the sleeve 200 in sealing the base 2 and the sleeve 200.

Figure 26A:
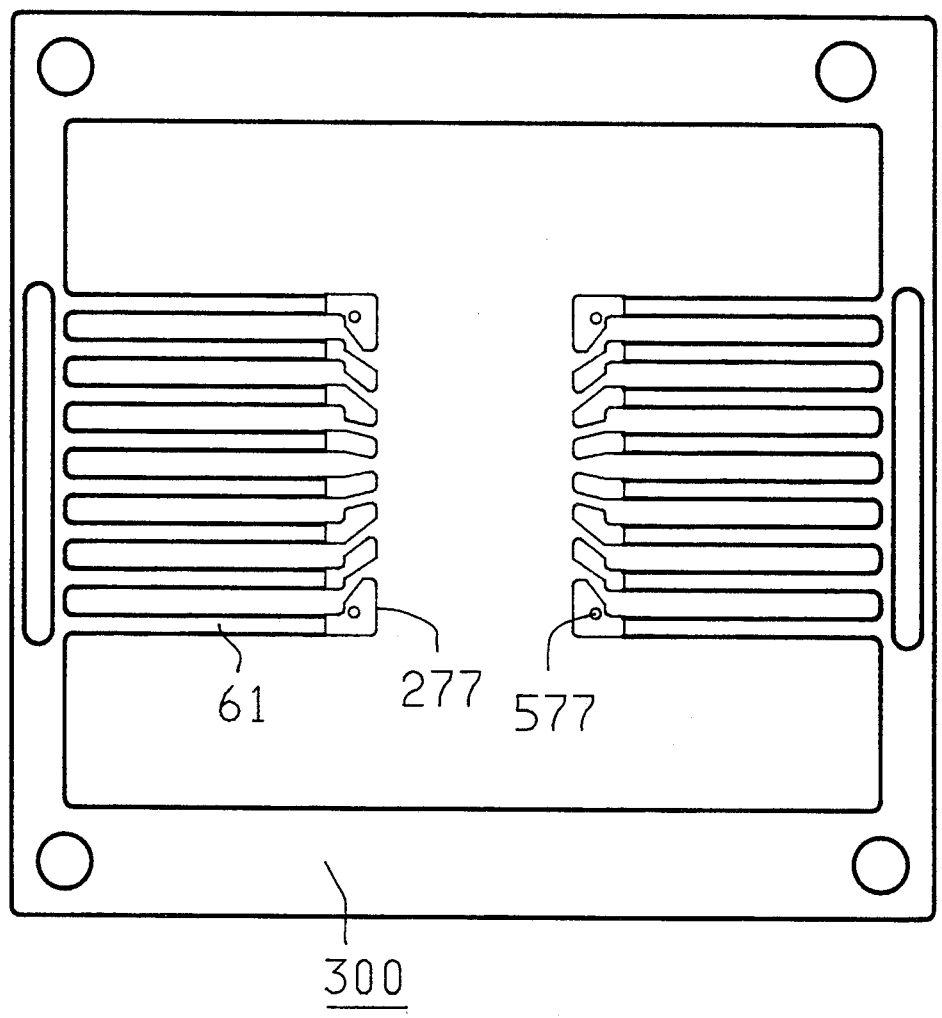
FIG. 26A is a plan view of a lead frame.
Figure 26B:
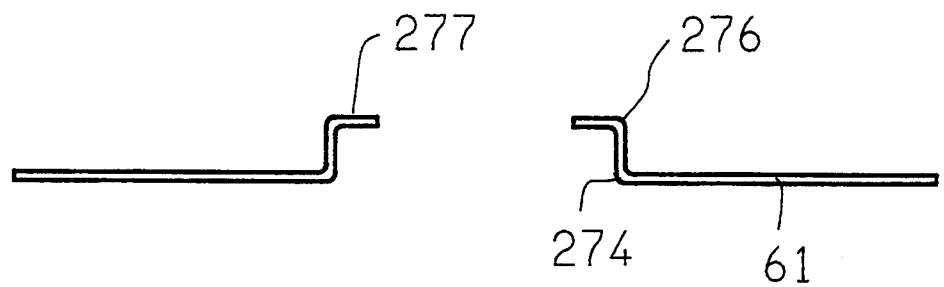
FIG. 26B is a side view thereof.

Next, the working method of the lead frame 300 will be described. FIG. 26A is a plan view of the lead frame 300 and FIG. 26B is a side view of the same. The lead frame 300 is formed by stamping a sheet of phosphor bronze by press work and then full-plating with Ni as foundation and with Au as finishing. Other working method such as etching work or wire cutting work may also be used besides the press work. Thereafter, the lead 61 is bent at bending points 276 and 274 and is then plastic-molded. In addition to the above working method, there is also considered, as a method exhibiting the excellent workability, one in which the full-platings with Ni as foundation and with Au as finishing are performed in advance of the press work. Further, there is a different method in which a full-plating with Ag is performed as foundation and the a plating with Au is performed only to the finishing surface (the surface to which the wire is bonded) or the bonding post portion 277 in consideration of the reduction of cost and, thereafter, the press work is performed.

FIGS. 27 show the process of wire bonding in the base 2. In this case, reversely to the sequence of the ordinary wire bonding, the wire is bonded first to the bonding post 277 and then to the bonding pad 280 on the chip 64. The reason why such reverse bonding is carried out is that, in the ordinary bonding, the clamper and the A1 wire 242 strike against the inner peripheral surface 506 of the base 2 to inhibit the bonding operation. Adoption of the reverse bonding process makes it possible to reduce the distance between the inner peripheral surface 506 of the base 2 and the wedge, with the result that it becomes possible to carry out the wire bonding even in locations suffering from obstacles.

According to the present invention, it is possible to provide a video camera unit in which the back focus of the lens is adjusted, thus coping with the reduction in efficiency percentage attributable to the fluctuation of the back focus.

TABLE 1

| Lens surface | $\gamma$ | d | n | $\nu$ |
|---|---|---|---|---|
| #1 | 0.888 | 0.208 (d1) | 1.492 | 56 |
| #2 | 0.848 | 0.436 (d2) | ... | |
| #3 | −1.024 | 0.366 (d3) | 1.492 | 56 |
| #4 | 13.381 | 0.332 (d4) | ... | |
| #5 | 2.039*1 | 0.488 (d5) | 1.492 | 56 |
| #6 | 0.725*2 | 0.229 (d6) | ... | |
| #7 | 0.996*3 | 0.416 (d7) | 1.492 | 56 |
| #8 | 1.060 | — | ... | | effective focal length E.F.L=1.0
F number (for brightness) F No.=2.0
field angel F.A.=87°
back focus B.F.=0.55
$\gamma$:curvature radius of lens surface
d:distance between lens surface
nd:refractive index of lens material for d-line
$\nu$d:dispersive power of lens material

TABLE 2

| | *1 | *2 | *3 |
|---|---|---|---|
| $K_2$ | 0 | 0 | 0 |
| $A_2$ | 0 | 0 | 0 |
| $A_4$ | $1.466 \times 10^{-2}$ | $3.460 \times 10^{-3}$ | $2.723 \times 10^{-3}$ |
| $A_6$ | $6.002 \times 10^{-3}$ | $3.002 \times 10^{-3}$ | $1.417 \times 10^{-3}$ |
| $A_8$ | $-2.382 \times 10^{-3}$ | $-6.772 \times 10^{-4}$ | $-4.251 \times 10^{-4}$ |
| $A_{10}$ | $3.149 \times 10^{-4}$ | $2.106 \times 10^{-5}$ | $3.955 \times 10^{-5}$ |

Notes:
Assuming that the x ordinate is taken in the direction of an optical axis, the y-ordinate is in the direction orthogonal thereto, and the paraxial radius is $r_i$, the non-spherical shape is represented by $$x = \frac{y^2/r_i}{1 + \sqrt{1 - (k_2 + 1)(y/r_i)^2}} + A_2 y^2 + A_4 y^4 + A_6 y^6 + A_8 y^8 + A_{10} y^{10}$$

where $A_2$, $A_4$, $A_6$, $A_8$ and $A_{10}$ are non-spherical co-efficients.

TABLE 3

| Lens surface | SA | CM | AS | DS | PT |
|---|---|---|---|---|---|
| #1 | 0.0028 | −0.0028 | 0.0027 | −0.0792 | 0.0771 |
| #2 | −0.0021 | −0.0007 | −0.0002 | −0.0276 | −0.0807 |
| #3 | −0.0014 | 0.0101 | −0.0731 | 1.0100 | −0.0668 |
| #4 | −0.0006 | −0.0055 | −0.0482 | −0.4663 | −0.0051 |
| #5 | −0.0763 | −0.0213 | 0.0985 | 0.7035 | 0.0659 |
| #6 | 0.0214 | −0.0358 | −0.0721 | −0.1375 | 0.0944 |
| #7 | −0.0071 | −0.0228 | −0.1297 | 0.1329 | 0.0687 |
| #8 | 0.0004 | −0.0061 | 0.0765 | −0.1500 | −0.0646 |
| Total | −0.0630 | −0.0850 | −0.1456 | 0.9854 | 0.0889 |

Seidel aberration coefficients
SA:spherical aberration coefficint
CM:coma coefficient
AS:astigmatism coefficient
DS:distorsion aberration coefficient
PT:Petzval coefficient

TABLE 4

| Lens surface | $\gamma$ | d | n | $\nu$ |
|---|---|---|---|---|
| #1 | 15.373 | 0.244 | 1.492 | 57.8 |
| #2 | 0.873*1 | 0.484 | | |
| #3 | 2.754 | 0.530 | 1.492 | 57.8 |
| #4 | 1.281 | 0.203 | | |
| #5 | 0.907*2 | 0.831 | 1.492 | 57.8 |
| #6 | 1.095 | 0.024 | | |
| #7 | 1.513*3 | 0.244 | 1.492 | 57.8 |
| #8 | 0.763 | | | | effective focal length E.F.L=1.0
F number F No.=1.8
field angle F.A.=75°
back focus B.F.=0.89
γ:curvature radius of lens surface
d:distance between lens surfaces
nd:refractive index of lens materal for d-line
νd:dispersive power of lens material

TABLE 5

|  | *1 | *2 | *3 |
|---|---|---|---|
| $K_2$ | 0 | 0 | 0 |
| $A_2$ | 0 | 0 | 0 |
| $A_4$ | $8.552 \times 10^{-3}$ | $-9.626 \times 10^{-4}$ | $-1.000 \times 10^{-2}$ |
| $A_6$ | $-1.738 \times 10^{-3}$ | $3.333 \times 10^{-4}$ | $5.172 \times 10^{-3}$ |
| $A_8$ | $3.566 \times 10^{-4}$ | $4.444 \times 10^{-5}$ | $-5.253 \times 10^{-3}$ |
| $A_{10}$ | $-1.479 \times 10^{-5}$ | $1.403 \times 10^{-6}$ | $5.906 \times 10^{-4}$ |

Notes:
Assuming that the x ordinate is taken in the direction of an optical axis, the y-ordinate is in the direction orthogonal thereto, and the paraxial radius is $r_i$, the non-spherical shape is represented by $$x = \frac{y^2/r_i}{1 + \sqrt{1 - (k_2 + 1)(y/r_i)^2}} + A_2 y^2 + A_4 y^4 + A_6 y^6 + A_8 y^8 + A_{10} y^{10}$$

where $A_2$, $A_4$, $A_6$, $A_8$ and $A_{10}$ are non-spherical co-efficients.

TABLE 6

| Lens surface | SA | CM | AS | DS | PT |
|---|---|---|---|---|---|
| #1 | 0.0000 | 0.0000 | 0.0031 | 0.5015 | 0.0052 |
| #2 | −0.0547 | 0.0850 | −0.2121 | 0.5443 | −0.0922 |
| #3 | 0.0000 | 0.0008 | 0.0356 | 0.2765 | −0.0292 |
| #4 | 0.0038 | −0.0109 | 0.0309 | −0.2659 | 0.0628 |
| #5 | 0.0157 | 0.0556 | 0.0931 | 0.2880 | 0.0888 |
| #6 | 0.0799 | −0.0083 | 0.0008 | −0.0078 | 0.0735 |
| #7 | −0.0698 | −0.0915 | −0.2225 | −0.1211 | 0.0532 |
| #8 | 0.0001 | 0.0031 | 0.0934 | −0.3618 | −0.1056 |
| Total | −0.0250 | 0.0338 | −0.1777 | 0.8537 | 0.0565 |

Seidel aberration coefficients
SA:spherical aberration coefficint
CM:coma coefficient
AS:astigmatism coefficient
DS:distorsion aberration coefficient
PT:Petzval coefficient

TABLE 7

| Lens surface | γ | d | n | ν |
|---|---|---|---|---|
| #11 | 1.067 | 0.372 | 1.492 | 56 |
| #12 | −2.572 | 0.211 | ... |  |
| #13 | −0.372*1 | 0.267 | 1.492 | 56 |
| #14 | −0.368 | 0.295 |  |  |
| #15 | 0.473*2 | 0.211 | 1.492 | 56 |
| #16 | 0.550 | ... | ... |  | effective focal length E.F.L=1.0
F number F No.=2.0
field angel F.A.=45°
back focus B.F.=0.42
γ:curvature radius of lens surface
d:distance between lens surface
nd:refractive index of lens material for d-line
νd:dispersive power of lens material

TABLE 8

|  | *1 | *2 |
|---|---|---|
| $K_2$ | 0 | 0 |
| $A_2$ | 0 | 0 |
| $A_4$ | $3.6524 \times 10^{-3}$ | $3.4555 \times 10^{-3}$ |

TABLE 8-continued

|  | *1 | *2 |
|---|---|---|
| $A_6$ | $3.9891 \times 10^{-4}$ | $8.3953 \times 10^{-4}$ |
| $A_8$ | $-5.1950 \times 10^{-5}$ | $-2.5228 \times 10^{-4}$ |
| $A_{10}$ | $2.3457 \times 10^{-5}$ | $2.1174 \times 10^{-5}$ |

Notes:
Assuming that the x ordinate is taken in the direction of an optical axis, the y-ordinate is in the direction orthogonal thereto, and the paraxial radius is $r_i$, the non-spherical shape is represented by $$x = \frac{y^2/r_i}{1 + \sqrt{1 - (k_2 + 1)(y/r_i)^2}} + A_2 y^2 + A_4 y^4 + A_6 y^6 + A_8 y^8 + A_{10} y^{10}$$

where $A_2$, $A_4$, $A_6$, $A_8$ and $A_{10}$ are non-spherical co-efficients.

TABLE 9

| Lens surface | SA | CM | AS | DS | PT |
|---|---|---|---|---|---|
| #11 | 0.0005 | 0.0001 | 0.0000 | −0.0128 | 0.0433 |
| #12 | 0.0010 | −0.0145 | 0.2076 | −3.2112 | 0.0180 |
| #13 | −0.0123 | 0.0923 | −0.6888 | 6.0639 | −0.1243 |
| #14 | 0.0119 | −0.0779 | 0.4188 | −2.7271 | 0.1258 |
| #15 | −0.0019 | −0.0054 | −0.0405 | 1.4448 | 0.0977 |
| #16 | 0.0000 | −0.0015 | 0.1065 | −1.5200 | −0.0845 |
| Total | −0.0008 | −0.0071 | 0.0036 | 0.0376 | 0.0760 |

Seidel aberration coefficients
SA:spherical aberration coefficint
CM:coma coefficient
AS:astigmatism coefficient
DS:distorsion aberration coefficient
PT:Petzval coefficient

What is claimed is:

1. A video camera unit comprising:
a plastic lens unit;
a cylindrical holder in which said plastic lens unit is housed, said cylindrical holder having a front end and a back end;
a cylindrical base member including a circular plate having a peripheral edge, and including a cylindrical upright member extending to a predetermined height from the peripheral edge of said circular plate to be integral therewith, said back end of said cylindrical holder being received by said cylindrical base member;
a solid-state image sensor chip mounted on said plate for receiving light having passed through said plastic lens unit, said height of said cylindrical upright member being such that at least part of said cylindrical upright member adjustably surrounds said back end of said cylindrical holder for focusing adjustment between said plastic lens unit and said solid-state image sensor on said circular plate when said back end of said cylindrical holder is received by said cylindrical base member;
a cylindrical case having front and back end openings opposed to each other and surrounding said cylindrical holder and said cylindrical upright member of said cylindrical base member, said cylindrical upright member of said cylindrical base member being coupled to said cylindrical case in an airtight structure; and
a transparent cap mounted on said cylindrical case in an airtight structure to cover said front end opening of said cylindrical case, said back end opening of said cylindrical case being covered with said circular plate of said cylindrical base member, and said lens unit in said cylindrical holder receiving light coming from through said transparent cap, wherein said cylindrical case, said cylindrical base member and said transparent cap cooperate with one another to provide an airtight sealed structure for said plastic lens unit and said solid-state sensor chip.

2. A video camera unit according to claim 1, wherein said cylindrical upright member has an inner diameter substantially equal to an outer diameter of said back end of said cylindrical holder.

3. A video camera unit according to claim 1, wherein an end of said upright member of said cylindrical base member and that portion of said case which contacts said end of said upright member are formed tapered, respectively.

4. A video camera unit according to claim 1, wherein an end of said upright member of said cylindrical base member is tapered to provide a chamfered portion and has a concave groove for application of a bonding agent.

5. A video camera unit according to claim 1, wherein said cylindrical base member is formed with grooves for carrying jigs in an outer peripheral portion thereof.

6. A video camera unit according to claim 1, wherein bonding and fixing of said cylindrical case and said cylindrical base member to each other is maintained by at least one press-fitting projection provided on an outer peripheral surface of said base member into said case.

7. A video camera unit according to claim 1, wherein said lens unit includes first and second lenses, wherein said second lens is interposed between said first lens and said sensor chip, and wherein, assuming that a diameter of said first lens is d1 and a diameter of said second lens is d2, the following formula is satisfied:

8. A video camera unit according to claim 1, wherein said transparent cap is spaced apart from said plastic lens unit.

9. A video camera unit according to claim 1, wherein said cylindrical base member is a one-piece unit.

10. A solid-state image pickup device comprising:
a base;
a solid-state image sensor mounted on said base;
a cylindrical holder having an inner wall, a front end and a back end, said back end being coupled to said base;
a plurality of plastic lenses housed in said cylindrical holder, each of said lenses having a central portion for focusing light and also being provided at its peripheral edge with a rib in contact with the inner wall of said cylindrical holder, wherein, for each of said lenses, the thickness of its rib is greater than the thickness of at least a part of said central portion of the lens, and wherein a surface of each of said ribs which contacts said inner wall of said cylindrical holder is tapered for facilitating insertion of said lenses into said holder for said housing of said lenses;
a lens holding cover provided at said front end of said cylindrical holder for fixing said plurality of plastic lenses; and
light shielding plates provided between adjacent ones of said plurality of plastic lenses,
wherein said light shielding plates are located between ribs of adjacent lenses, and wherein the thicknesses of said ribs and the thicknesses of said light shielding plates serve to define distances between the central portions of said lenses.

11. A solid-state image pickup device according to claim 10, wherein at least one of said plastic lenses is an aspherical lens.

12. A video camera unit according to claim 1, wherein said solid-state image sensor chip is a bare chip.

13. A solid-state image pickup device according to claim 10, wherein said solid-state image sensor is a bare chip.

14. An airtight sealed video camera unit using a bare solid-state image sensor chip comprising:
a plastic lens unit;
a cylindrical holder in which said plastic lens unit is housed, said cylindrical holder having a front end and a back end;
a one-piece cylindrical base member including a circular plate having a peripheral edge, and including a cylindrical upright member extending to a predetermined height from the peripheral edge of said circular plate to be integral therewith, said back end of said cylindrical holder being received by said cylindrical base member;
a bare solid-state image sensor chip mounted on said plate for receiving light having passed through said plastic lens unit, said height of said cylindrical upright member being such that at least part of said cylindrical upright member adjustably surrounds said back end of said cylindrical holder for focusing adjustment between said plastic lens unit and said bare solid-state image sensor on said circular plate when said back end of said cylindrical holder is received by said cylindrical base member;
a cylindrical case having front and back end openings opposed to each other and surrounding said cylindrical holder and said cylindrical upright member of said cylindrical base member, said cylindrical upright member of said cylindrical base member being coupled to said cylindrical case in an airtight structure; and
a transparent cap mounted on said cylindrical case in an airtight structure to cover said front end opening of said cylindrical case and to be spaced apart from said plastic lens unit, said back end opening of said cylindrical case being covered with said circular plate of said cylindrical base member, and said lens unit in said cylindrical holder receiving light coming from through said transparent cap;
wherein said cylindrical case, said cylindrical base member and said transparent cap cooperate with one another to provide a airtight sealed structure for said plastic lens unit and said solid-state image sensor chip.

15. An airtight sealed video camera unit according to claim 14, wherein said cylindrical upright member has an inner diameter substantially equal to an outer diameter of said back end of said cylindrical holder.

16. An airtight sealed video camera unit according to claim 14, wherein an end of said upright member of said cylindrical base member and that portion of said case which contacts said end of said upright member are formed tapered, respectively.

17. An airtight sealed video camera unit according to claim 14, wherein an end of said upright member of said cylindrical base member is tapered to provide a chamfered portion and has a concave groove for application of a bonding agent.

18. An airtight sealed video camera unit according to claim 14, wherein said cylindrical base member is formed with grooves for carrying jigs in an outer peripheral portion thereof.

19. An airtight sealed video camera unit according to claim 14, wherein bonding and fixing of said cylindrical case and said cylindrical base member to each other is maintained by at least one press-fitting projection provided on an outer peripheral surface of said base member into said case.

20. An airtight sealed video camera unit according to claim 14, wherein said lens unit includes first and second lenses, wherein said second lens is interposed between said first lens and said sensor chip, and wherein, assuming that a diameter of said first lens is d1 and a diameter of said second lens is d2, the following formula is satisfied:

$$d1 > d2.$$

* * * * *